United States Patent
Marchand et al.

(10) Patent No.: US 10,560,120 B2
(45) Date of Patent: Feb. 11, 2020

(54) ELEMENTARY CHECK NODE PROCESSING FOR SYNDROME COMPUTATION FOR NON-BINARY LDPC CODES DECODING

(71) Applicant: UNIVERSITE DE BRETAGNE SUD, Lorient (FR)

(72) Inventors: Cédric Marchand, Queven (FR); Emmanuel Boutillon, Lorient (FR)

(73) Assignee: UNIVERSITE DE BRETAGNE SUD, Lorient (FR)

( * ) Notice: Subject to any disclaimer, the term of this patent is extended or adjusted under 35 U.S.C. 154(b) by 235 days.

(21) Appl. No.: 15/694,062

(22) Filed: Sep. 1, 2017

(65) Prior Publication Data

US 2018/0076830 A1 Mar. 15, 2018

(30) Foreign Application Priority Data

Sep. 9, 2016 (EP) .................................... 16306135

(51) Int. Cl.
*H03M 13/11* (2006.01)
*H03M 13/00* (2006.01)

(52) U.S. Cl.
CPC .... *H03M 13/1131* (2013.01); *H03M 13/1171* (2013.01); *H03M 13/6552* (2013.01); *H03M 13/6555* (2013.01)

(58) Field of Classification Search
CPC .......... H03M 13/1131; H03M 13/1117; H03M 13/1171; H03M 13/6555; H03M 13/6552
See application file for complete search history.

(56) References Cited

U.S. PATENT DOCUMENTS

| 2011/0200149 | A1* | 8/2011 | Choi | .................. | H03M 13/114 |
| | | | | | 375/341 |
| 2015/0303942 | A1* | 10/2015 | Zhang | ................ | H03M 13/1105 |
| | | | | | 714/763 |
| 2016/0231962 | A1* | 8/2016 | Ware | .................... | G11C 7/1006 |
| 2019/0146866 | A1* | 5/2019 | Sharifi Tehrani | ... | G06F 11/1012 |

OTHER PUBLICATIONS

European Search Report for 16306135.1 dated Mar. 29, 2017.
(Continued)

*Primary Examiner* — Thien Nguyen
(74) *Attorney, Agent, or Firm* — Meagher Emanuel Laks Goldberg & Liao, LLP

(57) ABSTRACT

At least a method and an apparatus are presented to decode a signal encoded using an error correcting code. For example, a decoder comprising a check node processing unit is presented. The check node processing unit is configured to receive at least three input messages and to generate at least one output message. A syndrome calculator is configured to determine a set of syndromes from the at least three input messages using at least two elementary check node processors. A decorrelation unit is configured to determine, in association with at least an output message, a set of candidate components from the set of syndromes. A selection unit is configured to determine at least an output message by selecting components comprising distinct symbols from the set of candidate components associated with the at least an output message.

15 Claims, 6 Drawing Sheets

(56) References Cited

OTHER PUBLICATIONS

Schlafer Philipp et al: "Syndrome based check node processing of high order NB-LDPC decoders", 2015 22nd International Conference on Telecommunications (ICT), IEEE, Apr. 27, 2015 (Apr. 27, 2015), pp. 156-162.
Schlafer Philipp et al: "A new architecture for high throughput, low latency NB-LDPC check node processing", 2015 IEEE 26th Annual International Symposium on Personal, Indoor, and Mobile Radio Communications (PIMRC), IEEE, Aug. 30, 2015 (Aug. 30, 2015), pp. 1392-1397.
Garcia-Herrero Francisco et al: "Decoder for an enhanced serial generalized bit flipping algorithm", 19th IEEE International Conference on Electronics, Circuits and Systems (ICECS), IEEE, Dec. 9, 2012 (Dec. 9, 2012), pp. 412-415.
Marchand Cedric et al: "NB-LDPC check node with pre-sorted input", 2016 9th International Symposium on Turbo Codes and Iterative Information Processing (ISTC), IEEE, Sep. 7, 2016 (Sep. 7, 2016), pp. 196-200.
N. Wiberg, H-A. Loeliger, and R. Kotter, Codes and Iterative Decoding on General Graphs, European Transactions on Telecommunications and Related Technologies, special issue on Turbo Coding, Jun. 1995.
M. Davey and D. MacKay, Low-density parity check codes over GF (q), IEEE Communications Letters, vol. 2, No. 6, pp. 165-167, Jun. 1998.
D.J.C. Mackay and M. Davey, Evaluation of Gallager Codes for Short Block Length and High Rate Applications, In Proceedings of IMA Workshop on Codes, Systems and Graphical Models, 1999.
L. Barnault and D. Declercq, Fast decoding algorithm for LDPC over GF (q), In Proceedings of IEEE Information Theory Workshop, pp. 70-73, Apr. 2003.
H. Sadjadpour, Maximum a Posteriori Decoding Algorithms for Turbo Codes, In Proceedings of SPIE, vol. 4045, 2000.
D. Declercq and M. Fossorier, Decoding algorithms for non-binary LDPC codes over GF (q), IEEE Transactions on Communications, vol. 55, No. 4, pp. 633-643, Apr. 2007.
V. Savin, Min-Max decoding for non-binary LDPC codes, In Proceedings of IEEE International Symposium on Information Theory, pp. 960-964, Jul. 2008.
E. Boutillon and L. Conde-Canencia, Bubble check: a simplified algorithm for elementary check node processing in extended min-sum non-binary LDPC decoders, Electronics Letters, vol. 46, No. 9, pp. 633-634, Apr. 2010.
E. Boutillon, L. Conde-Canencia, and A. Al Ghouwayel, Design of a GF(64)-LDPC Decoder based on the EMS algorithm, IEEE Transactions on Circuits and Systems, vol. 60, No. 10, pp. 2644-2656, Oct. 2013.

\* cited by examiner

| Implementation | Number of ECNs | Number of sorted input couples | Total number of ECN outputs |
|---|---|---|---|
| FB $n_m = 20$ | 30 | 240 | 600 |
| SB-CN,Tree $NS = 50, n_{m,in} = 6, n_{m,out} = 20$ | 11 | 72 | 400 |
| SB-CN,Serial $NS = 50, n_{m,in} = 6, n_{m,out} = 20$ | 11 | 72 | 525 |

ELEMENTARY CHECK NODE PROCESSING FOR SYNDROME COMPUTATION FOR NON-BINARY LDPC CODES DECODING

TECHNICAL FIELD

The invention generally relates to digital communications, and in particular to methods and devices for decoding a signal encoded using an error correcting code.

BACKGROUND

Error correcting codes allow the detection and the correction of errors caused by channel noise, interference or any impairment affecting data during its storage or transmission from a transmitter to a receiver. The detection and/or correction of errors rely on the addition of redundant data to the original data during the encoding process.

Error correcting codes are used in numerous data transfer and storage systems and devices to provide a reliable and possibly error-free delivery of digital data over noisy unreliable transmission channels. Such techniques are facing significant demand and are used in various applications including voice and multimedia transmission for example in wireless ad-hoc networks (e.g. standardized in Wi-Fi 802.11), in radio communication systems (e.g. in 3G, 4G/LTE, 5G and beyond), in optical fiber-based transmission systems, and in digital video broadcasting (e.g. standardized in DVB-C2, DVB-S2X, and DVB-T2).

Linear codes belong to the class of error correcting codes. They are characterized by the linearity property of the codewords, according to which any linear combination of two or more codewords is a codeword.

According to a first linear 'convolutional coding' approach using convolutional codes, the encoding process is based on encoding data symbol-by-symbol.

According to a second linear 'block coding' approach, the encoding process is based on encoding data by blocks of symbols of a fixed size. Exemplary linear block codes comprise the Hamming codes, the Reed-Solomon codes, the Turbo codes and the low-density parity-check (LDPC) codes.

Error correcting codes may be binary or non-binary. Codes constructed over Galois Fields $GF(q)$ of order $q=2$ are binary codes. Accordingly, the various components of any codeword (hereinafter referred to as 'symbols') belong to the set of values $\{0,1\}$. Codes constructed over Galois Fields $GF(q)$ of order $q>2$ are non-binary. Accordingly, the various symbols take values in $GF(q)$.

Given the linearity property, any linear error correcting code can be represented by a generator matrix, generally denoted by G, and a parity-check matrix, generally denoted by H, linked by the relation $G \cdot H^t = 0$. Entries of the generator and parity-check matrices belong to the Field over which the code is constructed. The parity-check matrix defines the parity-check constraints designed to be satisfied by the codewords. In particular, LDPC codes are specified by sparse parity-check matrices comprising a number of zero entries very much higher than the number of non-zero entries.

Decoding data encoded using linear error correcting codes can be performed based on a graph representation of the code, so-called 'Tanner graph', associated with the parity-check matrix of the underlying code. The graph representation of a linear error correcting code comprises two sets of nodes: a first set of nodes referred to as 'variable nodes' and a second set of nodes referred to as 'check nodes'. Variable nodes and check nodes are linked together by edges. Variable nodes and check nodes form processing units. Each variable node is associated with a column of the parity-check matrix. Each check node is associated with a row of the parity-check matrix, i.e. with a parity-check equation. The connections between variable nodes and check nodes are determined by the non-zero entries of the parity-check matrix.

Iterative decoders can be used to decode data encoded using linear block error correcting codes. Given a noisy sequence of encoded symbols representing for example the output of a communication channel, an iterative decoder processes the noisy sequence during a number of iterations bringing it at each iteration closer to the original sequence of encoded symbols.

The Tanner graph representation can be used to implement iterative decoding. Accordingly, the decoding process can be performed by an iterative exchange of messages between the processing units associated with the variable nodes and check nodes via the different edges connecting them in the graph. Each variable node processing unit or check node processing unit receives input messages from the corresponding connected nodes in the graph and delivers, after processing the input messages, output messages to at least one processing unit corresponding to a connected node in the graph. The decoding process stops either if all parity-check constraints are satisfied, returning thus the decoded codeword, or by reaching a maximum number of iterations without meeting all parity check constraints.

Passed messages between the different variable node processing units and check node processing units carry information associated with the encoded symbols. A message may comprise a symbol and a metric measuring the reliability of the symbol (hereinafter referred to as 'reliability metric'). The reliability metric of a symbol may correspond for example to its estimated probability density function, measuring the probability that this symbol is equal to each value in the Field of construction of the code which was used to encode.

Early iterative decoding algorithms were designed for binary codes and apply to binary LDPC codes. They are the 'sum-product' algorithm (also known as 'belief propagation' or 'message passing' algorithm) and the 'min-sum' algorithm disclosed both in "N. Wibereg, H-A. Loeliger, and R. Kotter, Codes and Iterative Decoding on General Graphs, European Transactions on Telecommunications and Related Technologies, special issue on Turbo Coding, June 1995". They provide near-optimal performance in terms of error decoding probability.

Iterative decoding algorithms designed for non-binary codes were inspired by the 'sum-product' algorithm. Exemplary iterative decoders for non-binary codes comprise the 'q-ary sum-product' algorithm disclosed for example in:

"M. Davey and D. MacKay, Low-density parity check codes over GF(q), IEEE Communications Letters, vol. 2, no. 6, pages 165-167, June 1998", "D. J. C. Mackay and M. Davey, Evaluation of Gallager Codes for Short Block Length and High Rate Applications, In Proceedings of IMA Workshop on Codes, Systems and Graphical Models, 1999", and "L. Barnault and D. Declercq, Fast decoding algorithm for LDPC over GF(q), In Proceedings of IEEE Information Theory Workshop, pages 70-73, April 2003".

Some iterative decoding algorithms are based on logarithmic-scale computations for reducing the computational complexity by transforming product operations to simple summation operations. Such decoding schemes comprise:

the 'max-log-map' turbo codes decoder disclosed in "H. Sadjadpour, Maximum A Posteriori Decoding Algorithms For Turbo Codes, In Proceedings of SPIE, vol. 4045, 2000", the 'extended min-sum' (EMS) non-binary LDPC codes decoder disclosed in "D. Declercq and M. Fossorier, Decoding algorithms for non-binary LDPC codes over GF, IEEE Transactions on Communications, vol, 55, no. 4, pages 633-643, April 2007", and the 'min-max' non-binary LDPC codes decoder disclosed in "V. Savin, Min-max decoding for non-binary LDPC codes, In Proceedings of IEEE International Symposium on Information Theory, pages 960-964, July 2008".

The EMS algorithm is based on log-domain computations of the exchanged messages between the variable node processing units and the check node processing units. As the largest complexity of the EMS algorithm is the computation performed by the check node processing units, the EMS algorithm applies a sorting and truncation of processed messages to further alleviate the computational complexity and memory requirements at check node processing units. Message sorting is performed according to an order of the reliability metrics associated with the symbols comprised in the received input messages. Message truncation is performed for retaining the most reliable symbols in a given input and/or output message.

The computation of output messages at the level of the check node processing units from the sorted and truncated input messages can be performed according to various architectures. Existing architectures include "forward-backward" architectures and syndrome-based architectures.

In a "forward-backward" architecture, the computations performed by a check node processing unit are divided up into multiple serial calculations involving multiple elementary check node processing units (hereinafter referred to as 'elementary check node processors'). Each elementary check node processor processes two or more input messages to generate an intermediary message that is subsequently used by remaining elementary check node processors, at later stages. Computed intermediary messages are sorted based on the reliability metrics associated with the decoded symbols. In addition, an elimination of redundancies is performed by each elementary check node processor to suppress messages comprising the same symbols while keeping the message comprising the most reliable of the redundant symbols. Exemplary algorithms for elementary check node processing comprise:

the 'Bubble check' algorithm disclosed in "E. Boutillon and L. Conde-Canencia, Bubble check: a simplified algorithm for elementary check node processing in extended min-sum non-binary LDPC decoders, Electronics Letters, vol. 46, no. 9, pp. 633-634, April 2010", and an improved version of the 'Bubble check' algorithm known as 'L-Bubble check' disclosed "E. Boutillon, L. Conde-Canencia, and A. Al Ghouwayel, Design of a GF(64)-LDPC Decoder based on the EMS algorithm, IEEE Transactions on Circuits and Systems, vol. 60, no. 10, pages 2644-2656, October 2013".

The Bubble-check and L-Bubble check algorithms are based on a reduction of the search space of the best intermediary results computed by an elementary check node processor from two input messages.

In a syndrome-based architecture, a check node processing unit implements a syndrome-based decoding. The computation of output messages from the sorted and truncated input messages requires two steps. In a first step, the check node processing unit computes a set of values termed 'syndromes' involving all input messages. In a second step, a decorrelation operation is performed in association with each output message. The decorrelation operation consists in cancelling, from the computed syndromes, the contribution of the input message previously received from the variable node processing unit that is a recipient of the computed output message. The syndrome-based architecture is disclosed in:

"P. Schlafer, N. When, M. Alles, T. Lehnigk-Emden, and E. Boutillon, Syndrome based check node processing of high order NB-LDPC decoders, In Proceedings of the International Conference on Telecommunications, pages 156-162, April 2015";

"P. Schlafer, et al., A new Architecture for High Speed, Low Latency NB-LDPC Check Node Processing, In Proceedings of IEEE International Symposium on Personal, Indoor and Mobile Radio Communications, August 2015".

A syndrome-based architecture allows parallel computation, which is particularly advantageous for higher-order Galois fields. However, with such an architecture, the computational complexity is dominated by the number of computed syndromes which increases as the number of the input messages increases.

The forward-backward architecture allows a reduction of the hardware cost. However, it introduces high latency resulting in degradation in the system throughput. The syndrome-based architecture introduces high complexity mainly due to the increasing number of computed syndromes. The implementations of the syndrome-based architecture in practical decoding systems require significant computational and storage resources that are not always available. In particular, some practical implementations of this architecture are not adapted to the decoding of non-binary codes having high coding rates.

There is accordingly a need for developing an efficient and low-complexity architecture for check node processing units implemented in an EMS decoder in particular, and in any Tanner graph-based iterative decoder in general.

SUMMARY

In order to address these and other problems, there is provided a check node processing unit implemented in a decoder for decoding a signal. The check node processing unit is configured to receive at least three input messages and to generate at least one output message. The check node processing unit comprises:

a syndrome calculator configured to determine a set of syndromes from the at least three input messages using at least two elementary check node processors. Each syndrome comprises a symbol, a reliability metric associated with the symbol, and a binary vector;

a decorrelation unit configured to determine, in association with at least an output message, a set of candidate components from the determined set of syndromes. Each candidate component comprises a symbol and a reliability metric associated with this symbol. A set of candidate components comprises one or more pairs of components comprising a same symbol; and a selection unit configured to determine at least an output message by selecting components comprising distinct symbols from the set of candidate components associated with the at least an output message.

According to some embodiments, at least one elementary check node processor may be configured to determine an intermediary message from a first message and a second message, the first message and second message being derived from the received at least three input messages. An intermediary message may comprise one or more components and an intermediary binary vector associated with each component. Each component may comprise a symbol and a reliability metric associated with the symbol. Moreover, the one or more components comprised in an intermediary message may be sorted into a given order of the reliability metrics of symbols. In such embodiments, the syndrome calculator may be configured to determine a set of syndromes from the intermediary message determined from all input messages.

According to some embodiments, the provided check node processing unit may be implemented in a decoder for decoding a signal, the signal being encoded using at least one error correcting code. Each message from the received at least three input messages may comprise one or more components, each component comprising a symbol and a reliability metric associated with the symbol. In such embodiments, at least one elementary check node processor may be configured to determine the symbol comprised in a component of an intermediary message by applying an addition operation over a field of construction of the at least one error correcting code. The addition operation may be applied to the symbol comprised in a component of a first message and to the symbol comprised in a component of a second message.

According to some embodiments, at least one elementary check node processor may be configured to determine the reliability metric comprised in a component of an intermediary message by applying an addition operation over a given algebraic structure. The addition operation may be applied to the reliability metric comprised in a component of a first message and to the reliability metric comprised in a component of a second message.

In some embodiments, the given algebraic structure may be chosen in a group consisting of the field of real numbers, the field of integer numbers, and the field of natural numbers.

According to some embodiments, the syndrome calculator may be further configured to associate each component comprised in the at least three input messages with an initial binary value. Accordingly, each component of a first message and a second message may be associated with a binary vector derived from the initial binary values. In such embodiments, at least one elementary check node processor may be configured to determine the intermediary binary vector associated with a component of an intermediary message by applying a vector concatenation operation. The vector concatenation operation may be applied to the binary vector associated with a component of a first message and to the binary vector associated with a component of a second message.

In some embodiments, the components comprised in each input message may be sorted in a given order of the reliability metrics of the symbols comprised in these components. In such embodiments, the syndrome calculator may be configured to associate the component comprising the most reliable symbol with an initial binary value equal to a predefined first value and to associate the remaining components with an initial binary value equal to a predefined second value.

According to one embodiment, the predefined first value may be equal to zero and the predefined second value may be equal to one.

Further, the binary vector comprised in each syndrome may comprise a number of bits, each bit being associated with an output message. In such embodiments, the decorrelation unit may be configured to determine the set of candidate components associated with a given output message by selecting, among the determined set of syndromes, the syndromes that comprise binary vectors in which the bit associated with the given output message is equal to the predefined first value.

According to one embodiment, the elementary check node processors may be implemented in a serial architecture.

According to another embodiment, the elementary check node processors may be implemented in a tree architecture.

Still according to another embodiment, the elementary check node processors may be implemented in a hybrid architecture comprising some elementary check node processors implemented in a serial architecture and some elementary check node processors implemented in a tree architecture.

According to some embodiments, the selection unit may be configured to determine at least an output message by selecting a predefined number of components comprising distinct symbols from the set of candidate components associated with the at least an output message depending on the reliability metrics of the symbols in the set of candidate components.

In some embodiments, the at least one error correcting code may be a non-binary error correcting code.

There is also provided a method for calculating at least one output message at a check node processing unit implemented in a decoder. The decoder is configured to decode a signal. The check node processing unit is configured to receive at least three input messages. The method comprises:
  determining a set of syndromes from the at least three input messages. Each syndrome comprises a symbol, a reliability metric associated with the symbol, and a binary vector;
  determining, in association with at least an output message, a set of candidate components from the set of syndromes. Each candidate component comprises a symbol and a reliability metric associated with the symbol. The set of candidate components comprises one or more pairs of components comprising a same symbol; and
  determining at least an output message by selecting components comprising distinct symbols from the set of candidate components associated with the at least an output message.

There is further provided a computer program for calculating at least one output message at a check node processing unit implemented in a decoder. The decoder is configured to decode a signal. The check node processing unit is configured to receive at least three input messages. The computer program product comprises:
  A non-transitory computer readable storage medium and instructions stored on the non-transitory computer readable storage medium that, when executed by a processor, cause the processor to:
    determine a set of syndromes from the at least three input messages. Each syndrome comprises a symbol, a reliability metric associated with the symbol, and a binary vector;
    determine, in association with at least an output message, a set of candidate components from the set of syndromes. Each candidate component comprises a symbol and a reliability metric associated with the symbol. The set of candidate components comprises one or more pairs of components comprising a same symbol; and determine at least an output message by selecting components comprising distinct symbols from the set of candidate components associated with the at least an output message.

Advantageously, the various embodiments allow reducing the number of computed syndromes involved in the computation of output messages at check node processing units. As a result, the computational complexity at check node processing units implemented in error correcting code decoders can be significantly reduced.

Further, the various embodiments allow a double benefit from the parallelism of syndrome-based decoding and the linear complexity of elementary check node processing. Such a combination allows a reduction in the costs of the hardware implementation of check node processing units, throughput improvements and silicon area savings.

Further advantages of the present invention will become clear to the skilled person upon examination of the drawings and the detailed description.

BRIEF DESCRIPTION OF THE DRAWINGS

The accompanying drawings, which are incorporated in and constitute a part of this specification, illustrate various embodiments of the invention together with the general description of the invention given above, and the detailed description of the embodiments given below.

DETAILED DESCRIPTION

Embodiments of the present invention provide devices, methods, and computer program products for decoding a signal that was encoded using an error correcting code, with a reduced computational complexity. In particular, the various embodiments provide improved architectures of check node processing units implemented in iterative decoding algorithms used to decode a signal that was encoded using a non-binary error correcting code.

Methods, devices and computer program products according to the various embodiments may be implemented in various types of digital data transmission and storage systems and can be used in different types of applications, such as for example wired, wireless and optical communications, solid state data storage, magnetic and optical recording, digital television and video broadcasting.

The following description of some embodiments of the invention will be made with reference to digital communication systems, for illustration purpose only. However, the skilled person will readily understand that the various embodiments of the invention may be integrated in other types of systems (e.g. wired, wireless, acoustic, optical, and molecular systems, etc.).

Further, the following description of some embodiments of the invention will be made with reference to linear block error correcting codes, for illustration purpose only, although the skilled person will readily understand that the various embodiments of the invention may apply to any type of linear codes (comprising convolutional codes) and more generally to any type of error correcting codes.

Figure 1:
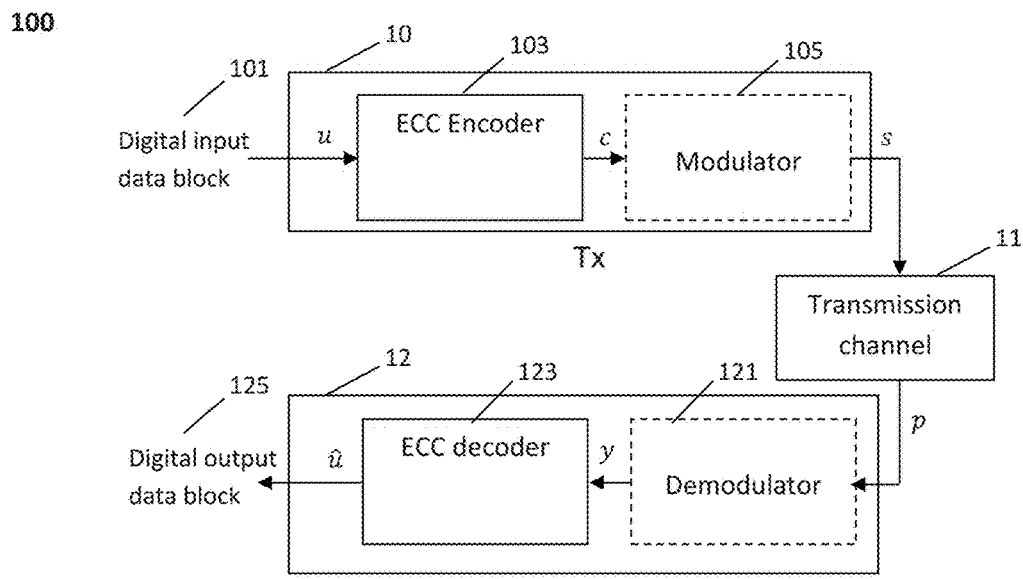
FIG. 1 is a block diagram of an exemplary application of the invention to communication systems, according to some embodiments.

Referring to FIG. 1, there is shown an exemplary implementation of the invention in a digital communication system 100. The communication system 100 may comprise a transmitter device 10 and a receiver device 12. The transmitter device 10 (hereinafter referred to as "transmitter") is configured to communicate data information to the receiver device 12 (hereinafter referred to as "receiver") via the transmission channel 11.

According to some embodiments of the invention, the transmitter 10 may comprise an error correcting code (ECC) encoder 103, configured to encode a digital input data block 101 denoted by u using a linear block error correcting code into a codeword c. The receiver 12 may be configured to receive a noisy copy p of the encoded data, or codeword, through the transmission channel 11. The receiver 12 may comprise an error correcting code decoder 123 configured to deliver a digital output data block 125 as an estimate û of the original digital input data block 101.

The digital input data 101 may be previously compressed before being encoded by the ECC encoder 103. Any source coding scheme (not shown in FIG. 1) adapted to increase the information throughput may be used to perform the compression. Data encoded by the ECC encoder 103 may be further modulated by a modulator 105. The modulator 105 may be configured to map the encoded data onto an analog signals and to map it onto the transmission channel 11.

The receiver 12 may comprise homologous processing means configured to perform the reverse functions. It may comprise a demodulator 121 configured to generate a signal y by performing a demodulation of the received signal p from the transmission channel prior to ECC decoding by the ECC decoder 123. The demodulator 121 may be configured to move the received signal or channel output back into baseband and perform low-pass filtering, sampling and quantization. The data decoded by the ECC decoder 123 may be further decompressed using any source decoder (not shown in FIG. 1). The ECC decoder 123 may be configured to implement an iterative decoding algorithm involving a number of check node processing units according to the various embodiments of the invention.

In an application of the invention to wired communication systems such as computer networking systems, the transmitter 10 and/or the receiver 12 may be any device configured to operate in a wired network. Exemplary devices in such application comprise computers, routers or switches connected to a small or large area wired network. Further, in such an application, the transmission channel 11 may be any type of physical cable used to ensure the transfer of data between the different connected devices.

In another application of the invention to wireless communication systems such as ad-hoc wireless networks, wireless sensor networks and radio communication systems, the transmitter 10 and/or the receiver 12 may be any type of fixed or mobile wireless device configured to operate in a wireless environment. Exemplary devices adapted for such application comprise laptops, tablets, mobile phones, robots, IoT devices, base stations, etc. The transmission channel 11 may be any wireless propagation medium suitable for this type of application. Further, the transmission channel 11 may accommodate several transmitters 10 and receivers 12. In such embodiments, multiple access techniques and/or network coding techniques may be used in combination with error correcting codes. Exemplary multiple access techniques comprise Time Division Multiple Access (TDMA), Frequency Division Multiple Access (FDMA), Code Division Multiple Access (CDMA), and Space Division Multiple Access (SDMA).

In still another application of the invention to optical communication systems such as optical fiber-based systems, the transmitter 10 and the receiver 12 may be any optical transceiver device configured to respectively transmit and receive data information propagated over an optical link. Exemplary optical communication systems comprise Polarization Division Multiplexing (PMD) and Mode Division Multiplexing (MDM) systems.

For any type of wired (e.g. optical fiber-based), wireless or deep-space (e.g. satellites, telescopes, space probes, etc.) communication systems, the transmission channel 11 may be any noisy channel. The noise may result from the thermal noise of the system components or the intercepted interfering radiation by antennas. Other exemplary sources of noise comprise switching, manual interruptions, electrical sparks and lightning. In some embodiments, the total noise may be modeled by an additive white Gaussian noise (AWGN).

Further, according to yet another application of the invention to digital mass storage, the transmission channel 11 may be modeled for example by an erasure channel, a binary symmetric channel, or a Gaussian channel. In such application, the transmission channel 11 may be any type of storage device which can be sent to (i.e. written) and received from (i.e. read).

The transmitter 10 and receiver 12 may be equipped with single or multiple antennas. In particular, in the presence of multiple transmit and/or receive antennas, Space-Time coding and decoding techniques may be used in combination with error correcting coding and decoding.

Further, encoded data may be transmitted over one or multiple frequency bands. When encoded data are transmitted over multiple frequency bands, the modulator 105 may use multi-carrier modulation formats such as OFDM (Orthogonal Frequency Division Multiplexing) and FBMC (Filter Bank Multi-Carrier).

According to various embodiments, the ECC encoder 103 may implement a linear block error correcting code designated by $\mathcal{C}(n, k)$; n and k referring respectively to the length of codewords and the length of an encoded data block. The ECC encoder 103 encodes accordingly a message vector u of length k into a codeword c, c being a vector of length n. The codeword c therefore comprises n elements, also referred to as "symbols". Among the n symbols, n−k symbols correspond to redundancy symbols, also called 'parity symbols'. The function of the extra parity symbols is to allow the receiver 12 to detect and possibly correct any error that occurred during the transmission.

For linear codes constructed over Galois Fields, generally denoted by GF(q), where q≥2 designates the cardinality of the code, the symbols take values in GF(q). A codeword c is thus a vector of n symbols that each belong to GF(q). The code is 'binary' if the symbols belong to GF(2). In contrast, when q>2, the code is qualified as 'non-binary'.

A linear code $\mathcal{C}(n, k)$ may be represented in a matrix form using a generator matrix denoted by G and a parity-check matrix denoted by H. Using a row notation of vectors, the generator matrix G is of dimensions k×n while the parity-check matrix is of dimensions (n−k)×n. The two matrices are linked by the relation G. $H^t$=0. In addition, entries of both matrices belong to the corresponding Galois Field. Using the matrix representation, any codeword c satisfies the equation c. $H^t$=0. This equation is also called "parity-check equation". It defines n parity-check constraints designed to be satisfied by any codeword.

In association with the matrix representation, the linear code $\mathcal{C}(n, k)$ may be represented using a bipartite graph $\mathcal{H}$ termed "Tanner graph". This graph comprises n variable nodes and n−k check nodes. Each variable node i ∈ {1,2, . . . , n} is associated with a column of the parity-check matrix. Each check node j ∈ {1,2, . . . , n−k} is associated with a row of the parity-check matrix, i.e. with a parity-check equation. A variable node i is connected to a check node j if the entry $H_{ij}$ of the parity-check matrix is not equal to zero, i.e. if $H_{ij} \neq 0$. $\mathcal{H}_v(i)$ denotes the set of neighbor check nodes connected to the variable node i. Similarly, $\mathcal{H}_c(j)$ denotes the set of neighbor variable nodes connected to the check node j. The degree of a variable node i (equivalently a check node j) corresponds to the cardinality of the set $\mathcal{H}_v(i)$ (equivalently the cardinality of the set $\mathcal{H}_c(j)$).

The following description of some embodiments will be made with reference to an ECC encoder 103 encoding data using a non-binary LDPC code, for illustration purpose only. However, the skilled person will readily understand that the various embodiments of the invention also apply to other non-binary codes and in general to binary and non-binary linear block error correcting codes and non-binary turbo codes.

For the purpose of example, the ECC decoder 123 implements a non-binary LDPC code decoder for decoding the data encoded by the ECC encoder 103 using a non-binary LDPC code. The ECC decoder 123 may implement any iterative non-binary LDPC code decoder such as the Extended Min Sum algorithm or the min-max algorithm.

According to a particular application to the EMS algorithm, the various embodiments of the invention provide efficient and low-complexity implementations of check node processing units involved in the iterative decoding process using an EMS algorithm. The description of the invention is made with reference to the EMS algorithm. However, the skilled person will readily understand that the various embodiments apply to any iterative non-binary LDPC codes decoder such as the min-max decoding algorithm.

Figure 2:
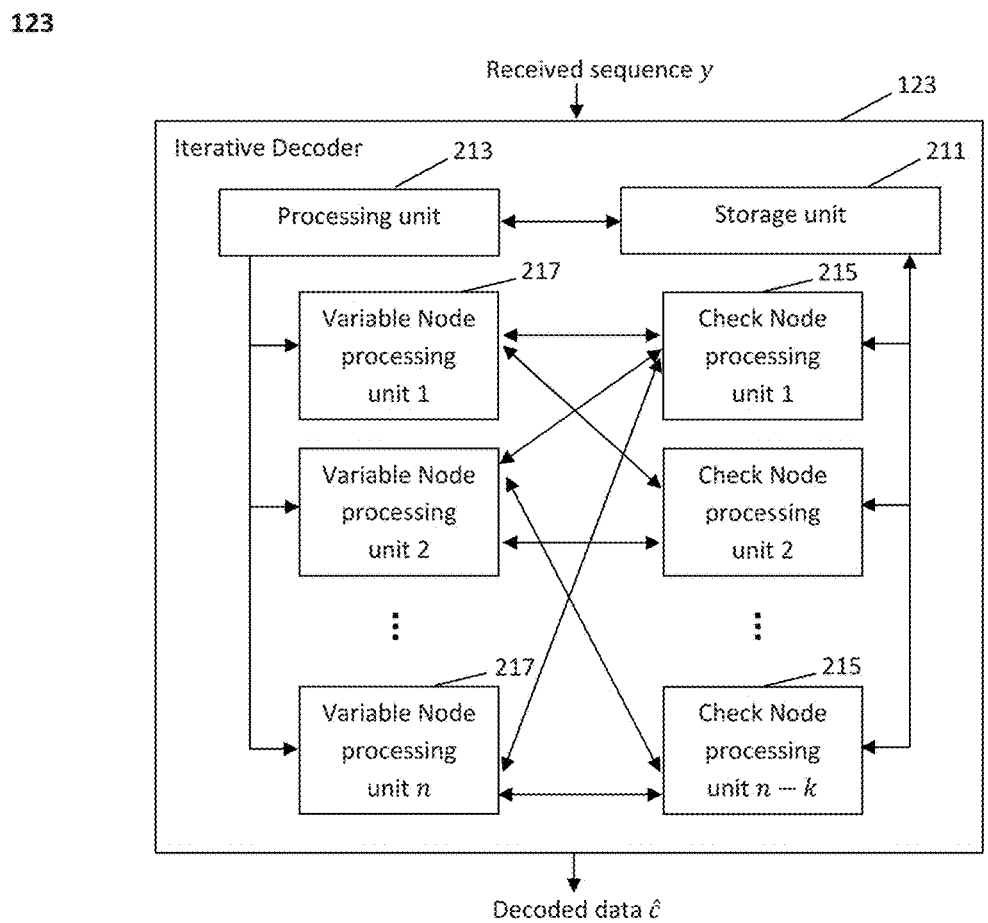
FIG. 2 is a block diagram of an iterative decoder according to some embodiments.

Referring to FIG. 2, there is illustrated a structure of an iterative non-binary LDPC decoder 123, according to some embodiments using the EMS algorithm.

The iterative decoder 123 may be configured to determine an estimate $\hat{c}$ of the transmitted codeword c by the transmitter 10 from a received noisy sequence y. It may process a signal over several iterations bringing it, at each iteration, closer to the transmitted codeword c.

The iterative decoder 123 may be configured to determine the estimate $\hat{c}$ based on the Tanner graph representation of the code $\mathcal{C}$(n, k) used at the transmitter 10. Accordingly, the iterative decoder 123 may comprise n variable node processing units 217 and n−k check node processing units 215. Each variable node processing unit 217 maps to one variable node in the Tanner graph. Each check node processing unit 215 maps to one check node in the Tanner graph. The variable node processing units 217 and check node processing units 215 may be configured to iteratively exchange messages to estimate the most reliable codeword $\hat{c}$ from the noisy sequence y.

A variable node processing unit 217 corresponding to a variable node i may be configured to receive input messages from the check node processing units 215 of the set $\mathcal{H}_v(i)$. A variable node processing unit 217 may be further configured to process these input messages and deliver output messages to at least one check node processing unit 215 of the set $\mathcal{H}_v(i)$.

Similarly, a check node processing unit 215 corresponding to a check node j may be configured to receive input messages from the variable node processing units 217 of the set $\mathcal{H}_c(j)$. A check node processing unit 215 may be further configured to process these input messages and deliver output messages to at least one variable node processing unit 217 of the set $\mathcal{H}_c(j)$.

The processing performed by the various variable node processing units and check node processing units may be implemented according to several scheduling techniques.

According to a first implementation, all variable node processing units 217 may be configured to operate in a first round and then the check node processing units 215 may be configured to update the messages to be sent to the variable nodes. This specific scheduling is known as "flooding scheduling". In particular, the check node processing units 215 may be configured to operate serially or in parallel where from 2 to n−k check node processing units 215 may operate at the same time.

According to a second implementation based on a "horizontal scheduling", the check node processing units 215 may be configured to operate serially, updating all variable node processing units 217 connected to the check node processing units 215. In particular, a group of check node processing units 215 may be configured to operate in parallel, updating all connected variable node processing units 217 provided that there is no variable node processing unit 217 in conflict (e.g. when two check node processing units 215 are connected to the same variable node processing unit 217).

According to a third implementation based on a "vertical scheduling", the variable node processing units 217 may be configured to operate serially, updating all check node processing units 215 which are connected to them.

The exchange of messages may be initialized by the variable node processing units 217. It may terminate either if the processed signal satisfies the parity-check equation or if a maximum number of iterations is reached without meeting all parity-check constraints. In the former case (if the processed signal satisfies the parity-check equation), the iterative decoder 123 may be configured to deliver the processed signal as an estimate of the original codeword. In the latter case (if a maximum number of iterations is reached without meeting all parity-check constraints), the iterative decoder 123 may be configured to declare a decoding failure but nevertheless output the codeword estimated at the last iteration.

As illustrated in FIG. 2, the iterative decoder 123 may further comprise a storage unit 211 configured to store the received sequence y. It may also comprise a processing unit 213 configured to determine initial values of output messages to be delivered by the variable node processing units 217 based on the received sequence y loaded from the storage unit 211.

The exchanged messages between the variable node processing units 217 and the check node processing units 215 may carry information associated with the symbols. A message sent from a variable node processing unit 217, corresponding to a variable node i, to a check node processing unit 215, corresponding to a check node j, in the set $\mathcal{H}_v(i)$ is denoted by $U_i$. Similarly, a message sent from a check node processing unit 215 corresponding to a check node j to a variable node processing unit 217 corresponding to a variable node i in the set $\mathcal{H}_c(j)$ is denoted by $V_i$.

According to some embodiments, the length of an exchanged message may be equal to the order of the Galois field used to construct the linear code. Accordingly, each exchanged message $U_i$ and $V_i$ may be a vector of length q for codes constructed over GF(q).

In other embodiments related to soft-decision decoding, exchanged messages may carry the values of the symbols and metrics measuring their reliabilities (hereinafter referred to as 'reliability metrics'). The value of the reliability metric is related to the reliability of the symbol. In such embodiments, each message $U_L$ and $V_i$ may be a vector comprising q couples of values (hereinafter referred to as "components"), a component comprising a value of a symbol and its reliability metric. Each component of a message accordingly corresponds to a couple of values including:
  a value of the symbols in GF(q), and
  its reliability metric.

In some embodiments, the reliability metric of a symbol may correspond to an estimated probability density function of the symbol which represents the probability that the symbol is correct. In particular, the reliability metric may be represented in the log-domain by a logarithmic likelihood ratio (LLR) value.

The computational complexity of the decoding process is dominated by the computations performed by the check node processing units 215. In one embodiment using the EMS algorithm for decoding non-binary LDPC codes, the computational complexity of the processing performed by the check node processing units 215 may be reduced without sacrificing the decoding error performance.

Figure 3:
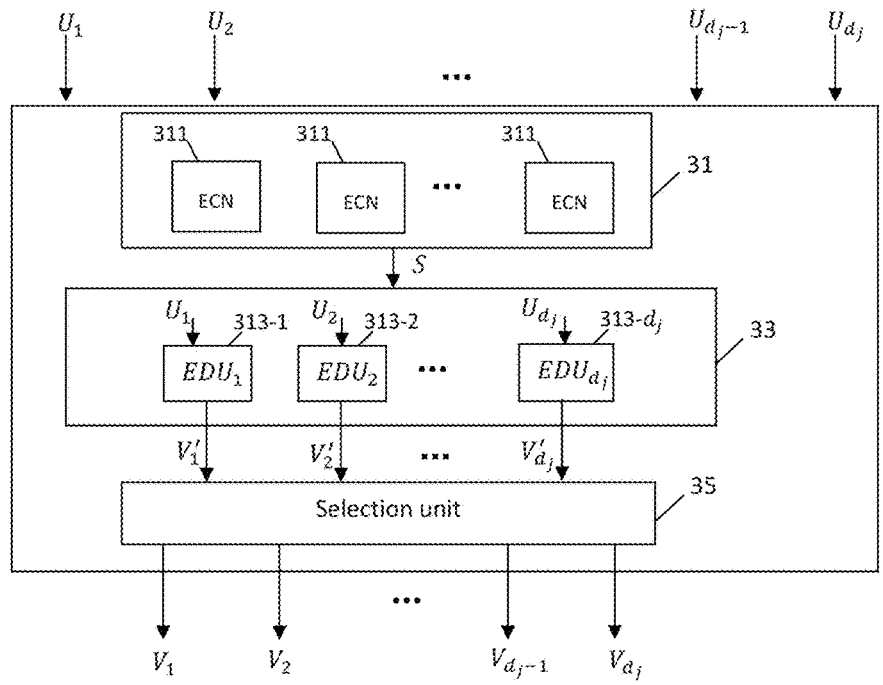
FIG. 3 is a block diagram illustrating the structure of a check node processing unit according to some embodiments.

Referring to FIG. 3, there is shown a block diagram of a check node processing unit 215, according to some embodiments of the invention. The check node processing unit 215 is associated with a check node j of degree $d_j$. This means that the corresponding check node is connected to $d_j$ variable nodes in the Tanner graph representing the code. The check node processing unit 215 may thus be configured to exchange messages with one or more variable node processing units 217 among the $d_j$ variable node processing units 217 associated with the $d_j$ connected variable nodes. Accordingly, at a given iteration, the check node processing unit 215 may be configured to receive $d_j$ input messages and to generate at least one output message. An input or output message is a vector comprising q components, each component comprising a symbol and its reliability metric. The input messages may be sorted and/or truncated.

To facilitate the understanding of the following description of some embodiments, a focus on the processing at a check node processing unit with a notation at the level of the check node processing unit will be used. Accordingly, the check node processing unit 215 depicted in FIG. 3 may be of degree $d_j$ configured to receive $d_j$ input messages denoted by $U_1, U_2, \ldots, U_{d_j}$ and to generate $d_j$ output messages denoted by $V_1, V_2, \ldots, V_{d_j}$. The degree of the check node processing unit 215 may be advantageously given by $d_j \geq 3$.

According to some embodiments using the EMS algorithm, the messages delivered to check node processing units 215 may be sorted and truncated so as to keep only the $n_{m,in}$ most reliable components, with $n_{m,in}$ being strictly lower than $q(_{m,in} \ll q)$. The sorting may be performed in a given order (for example by increasing or decreasing order) of the reliability metrics associated with the symbols. Further, the sorting and truncation operations may be performed by the variable node processing units 217 or by the check node processing units 215 which receive the messages as inputs.

The following description will be made with reference to some embodiments using soft-output decoding based on sorting and truncation of the input messages received by the check node processing unit 215, for illustration purpose only. In such embodiments, each input message $U_i$ is a vector comprising $n_{m,in}$ components of a form $U_i = (U_i[0], U_i[1], \ldots, U_i[n_{m,in}-1])$ and each output message $V_i$ is a vector comprising $n_{m,out} \geq n_{m,in}$ components of a form $V_i = (V_i[0], V_i[1], \ldots, V_i[n_{m,out}-1])$. A component $U_i[j] = (U_i^{\oplus}[j], U_i^+[j])$ for $j=0, \ldots, n_{m,in}-1$ comprises a symbol denoted by $U_i^{\oplus}[j]$ and the reliability metric associated with this symbol denoted by $U_i^+[j]$. The components of each input message may be sorted such that the component comprising the most reliable symbol corresponds to the component $U_i[0]$, for $i=1, \ldots, d_j$ and that $U_i^+[j+1] \geq U_i^+[j]$ for $j=0, \ldots, n_{m,in}-2$.

Referring to FIG. 3, the check node processing unit 215 may comprise a syndrome calculator 31 comprising at least two elementary check node processors 311. In particular, a check node processing unit 215 of degree $d_j$ may comprise $d_j-1$ elementary check node processors 311. Each elementary check node processor 311 may be configured to determine an intermediary message from a first message and a second message, the first and the second message being derived from the input messages. An intermediary message denoted by $U'_t$ may comprise a number $n_t$ of sorted components and an intermediary binary vector associated with each component, the components comprised in a given intermediary message being sorted according to a given order of the reliability metrics of the symbols comprised therein.

The syndrome calculator 31 may be configured to determine a set of NS syndromes denoted by $S=\{S_1, S_2, \ldots, S_{NS}\}$ from all the input messages. More specifically, the syndrome calculator 31 may be configured to determine the set of syndromes from the intermediary message computed by a check node processor 311 by processing all input messages. A syndrome denoted by $S_r = (S_r^{\oplus}, S_r^+, S_r^{DBV})$ for $r=1, \ldots, NS$ may comprise a GF(q) symbol denoted by $S_r^{\oplus}$, the reliability metric associated with this symbol and denoted by $S_r^+$, and a binary vector denoted by $S_r^{DBV}$.

The use of the elementary check node processors 311 for the computation of the syndromes enables reducing the computational complexity of syndrome decoding. Indeed, with the use of elementary check node processors 311, the number of computed syndromes used for determining output messages is reduced, thereby making it possible to exploit the parallelism of syndrome decoding while alleviating the computational complexity which is generally due to the high number of computed syndromes. In addition, the elementary check node processors 311 provide sorted components (depending on the order of the reliability metrics of the symbols) in the computed intermediary messages. As a result, the sorting operation conventionally applied after syndrome calculation can be removed, thereby enabling a reduction of the computational complexity required for the sorting process as well as a reduction of the implementation costs.

According to some embodiments, the number of syndromes NS may be greater than or equal to the number of components in each input message and may depend on the order of the Galois Field.

For example, in GF(64), the number of syndromes may be given by $NS=3n_{m,out}=9n_{m,in}$, the number of components comprised in each output message being typically equal to $n_{m,out}=20$.

a. In another example considering GF(256), the number of syndromes may be given by $NS=3n_{m,out}=25n_{m,in}$, the number of components comprised in each output message being typically equal to $n_{m,out}=60$.

Still in another example for GF(1024), the number of syndromes may be given by $NS=3n_{m,out}=45n_{m,in}$, the number of components comprised in each output message being typically equal to $n_{m,out}=150$.

According to some embodiments, each elementary check node processor 311 may be configured to determine the symbol comprised in a component of an intermediary message by applying an addition operation over the Galois Field to the symbol comprised in a component of the first message and the symbol comprised in a component of the second message.

Moreover, each elementary check node processor 311 may be configured to determine the reliability metric associated with the symbol comprised in a component of an intermediary message by applying an addition operation over a given algebraic structure to the reliability metric comprised in a component of the first message and the reliability metric comprised in a component of the second message.

According to some embodiments, the algebraic structure may be chosen in a group consisting of the field $\mathbb{R}$ of real numbers, the field $\mathbb{Z}$ of integer numbers, and the field $\mathbb{N}$ of natural numbers.

a. For example in quantized hardware implementations and software implementations, each elementary check node processor 311 may be configured to determine the reliability metric associated with the symbol comprised in a component of an intermediary message by applying an addition operation over the integer field $\mathbb{Z}$ or the field of natural numbers $\mathbb{N}$, enabling a complexity reduction.

According to some embodiments, the syndrome calculator 31 may be further configured to associate an initial binary value with each component $U_i[j]$ comprised in the input messages $U_i$ for $i=1, \ldots, d_j$ and $j=0, \ldots, n_{m,in}-1$.

According to some embodiments, the syndrome calculator 31 may be configured to associate the initial value with the components $U_i[j]$ depending on the reliability metrics $U_i^+[j]$. In particular, the syndrome calculator 31 may be configured to associate the component comprising the most reliable symbol with an initial binary value equal to a predefined first value and to associate the remaining components with an initial binary value equal to a predefined second value.

According to some embodiments, the predefined first value may be equal to zero ('0') and the predefined second value may be equal to one ('1'). In such embodiments, the binary value associated with a component $U_i[j]$ may be denoted by $U_i^{DBV}[j]$ and may be given by:

$$U_i^{DBV}[j] = \begin{cases} 1 & \text{if } j \neq 0 \\ 0 & \text{if } j = 0 \end{cases} \quad (1)$$

Considering sorted input messages, conditional equation (1) states that the initial binary value associated with a component comprised in an input message is assigned a bit '0' value if the symbol comprised in said component is the most reliable symbol.

According to other embodiments, the predefined first value may be equal to one ('1') and the predefined second value may be equal to one ('0'). Accordingly, the initial binary value associated with a component comprised in an input message maybe equal to bit '1' if the symbol comprised in this component is the most reliable symbol, that is $$U_i^{DBV}[j] = \begin{cases} 0 & \text{if } j \neq 0 \\ 1 & \text{if } j = 0 \end{cases}.$$

Accordingly, each component of the first message and the second message processed by a given elementary check node processor 311 may be associated with a binary vector derived from the initial binary values. In such embodiments, each elementary check node processor 311 may be configured to determine the intermediary binary vector associated with a component of an intermediary message by applying a vector concatenation of the binary vector associated with a component of the first message and the binary vector associated with a component of the second message.

In particular, an elementary check node processor 311 may be configured to determine an intermediary message and an intermediary binary vector associated with each component of the intermediary message from two input messages, the first and second messages being equal to a first input message and a second input message respectively.

Figure 4:
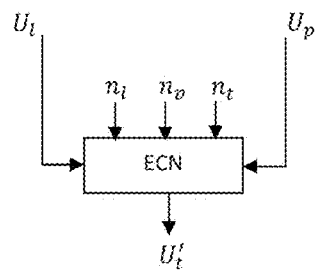
FIG. 4 is a block diagram representing the structure of an elementary check node processing unit according to an embodiment of the invention.

To illustrate the computation of an intermediary message by an elementary check node processor 311, the following description will be made with reference to processing a first and a second message both equal to input messages. FIG. 4 shows an elementary check node processor 311 according to such an embodiment. Accordingly, an elementary check node processor 311 may be configured to process a first input message $U_l$ and a second input message $U_p$ for 1 and $p \neq 1$ varying in the set of indices from 1 to $d_j$. From these two input messages each comprising $n_{m,in}$ components of a symbol and its reliability metric, an elementary check node processor 311 may be configured to determine an intermediary message denoted by $U'_t$ comprising a number $n_t$ of components $U'_t[j]=(U'_t{}^{\oplus}[j], U'_t{}^+[j])$ and determine an intermediary binary vector denoted $U'_t{}^{DBV}[j]$ in association with each component $U'_t[j]$. The components of the intermediary message may be sorted according to a given order depending on the reliability metrics of the symbols comprised therein such that $U'_t{}^+[j+1] \geq U'_t{}^+[j]$ for all $j=0, \ldots, n_t-2$.

According to some embodiments, the elementary check node processor 311 may be configured to determine the intermediary message by processing a number $n_l \leq n_{m,in}$ of components from the first message $U_l$ and/or a number $n_p \leq n_{m,in}$ of components from the second message $U_p$.

According to some embodiments in which the first message and second message are different from the input message, i.e. correspond to intermediary messages delivered by previous elementary check node processors 311 in the architecture, the number $n_l$ of components processed from the first message and/or the number $n_p$ of components processed from the second message may correspond to the number of components previously delivered by an elementary check node processor 311. In other words, the number of components processed by a given elementary check node processor 311 may depend on the number of components comprised in the previous intermediary messages processed by the elementary check node processors located at previous stages in the architecture.

According to some embodiments, the elementary check node processor 311 may be configured to determine the intermediary message $U'_t$ according to three steps.

At a first step, the elementary check node processor 311 may be configured to determine a set of auxiliary output components from the components of the first message $U_l$ and the components of the second message $U_p$. An auxiliary output component is referred to as a "Bubble". A Bubble denoted by $B_t[u][v]$ refers to the Bubble obtained from the component $U_l[u]$ comprised in the first message $U_l$ and the component $U_p[v]$ comprised in the second message $U_p$. The index u varies in $0,1, \ldots, n_l-1$ and the index v varies in $0,1, \ldots, n_p-1$. A Bubble comprises a couple of data comprising:

a symbol denoted by $B_t{}^{\oplus}[u][v]$, and its reliability metric denoted by $B_t{}^+[u][v]$ and a binary vector denoted by $B_t{}^{DBV}[u][v]$ associated with this couple. The total number of Bubbles is accordingly given by $n_l \times n_p$.

According to some embodiments, the elementary check node processor 311 may be configured to determine the symbol $B_t{}^{\oplus}[u][v]$ of an auxiliary output component $B_t[u][v]$ by applying an addition operation over the Field of construction of the error correcting code, namely over the Galois Field GF (q). The addition operation is applied to the symbol $U_l{}^{\oplus}[u]$ comprised in the component $U_l[u]$ of the first message $U_l$ and to the symbol $U_p^{\oplus}[v]$ comprised in the component $U_p[v]$ of the second processed message $U_p$ such that:

$$B_t^{\oplus}[u][v]=U_l^{\oplus}[u]\oplus U_p^{\oplus}[v] \quad (2)$$

In equation (2), the operator $\oplus$ stands for the addition operation over the Galois field.

According to some embodiments, the elementary check node processor 311 may be configured to determine the reliability metric $B_t^+[u][v]$ of an auxiliary output component $B_t[u][v]$, by applying an addition operation over a given algebraic structure, to the reliability metric $U_l^+[u]$ comprised in the component $U_l[u]$ of the first message $U_l$ and to the reliability metric $U_p^+[v]$ comprised in the component $U_p[v]$ of the second message $U_p$ such that:

$$B_t^+[u][v]=U_l^+[u]+U_p^+[v] \quad (3)$$

According to some embodiments, the elementary check node processor 311 may be configured to determine the intermediary binary vector $B_t^{DBV}[u][v]$ in association with the auxiliary output component $B_t[u][v]$ by applying a vector concatenation operation. The vector concatenation operation may be applied to the binary vector $U_l^{DBV}[u]$ associated with the component $U_l[u]$ of the first message $U_l$ and to the binary vector $U_p^{DBV}[v]$ associated with the component $U_p[v]$ of the second message $U_p$ such that:

$$B_t^{DBV}[u][v]=(U_l^{DBV}[u]\|U_p^{DBV}[v]) \quad (4)$$

In equation (4), the operator $\|$ stands for the concatenation operation which provides, from two or more input scalars or vectors, a list in the form of a vector, the elements of the list being equal to the concatenated inputs.

At a second step, the elementary check node processor 311 may be configured to sort the determined $n_l \times n_p$ auxiliary output components according to a given order of the reliability metrics of the symbols comprised in these components.

At a third step, the elementary check node processor 311 may be configured to select, among the $n_l \times n_p$ sorted auxiliary output components the $n_t$ components comprising the most reliable symbols, which provides the intermediary message $U'_t$ and the binary vector associated with each component of the $n_t$ components comprised in this intermediary message.

Further, the number $n_t$ of components comprised in an intermediary message may be lower than $n_l \times n_p$.

The number of elementary check node processors 311 may depend on the implementation architecture used at the syndrome calculator.

According to some embodiments, the syndrome calculator 31 may comprise a plurality of elementary check node processors 311 implemented in a serial architecture.

Figure 5:
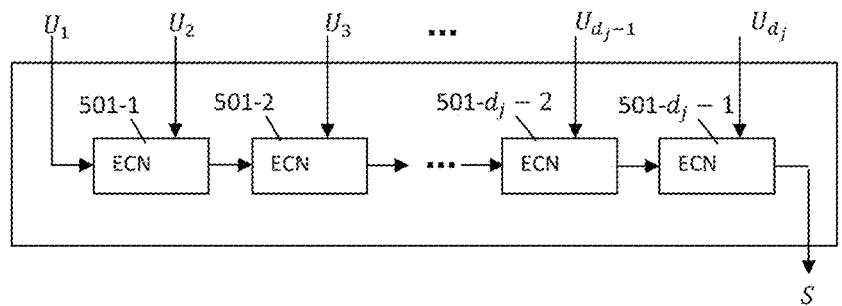
FIG. 5 is a block diagram representing the structure of a syndrome calculator according to an embodiment in which a plurality of elementary check node processors are implemented in a serial architecture.

FIG. 5 shows a structure of a syndrome calculator 31 implementing a serial architecture. Accordingly, for a check node processing unit 215 of degree $d_j$, the syndrome calculator 31 may comprise $d_j$−1 elementary check node processors 501-l for l=1, . . . , $d_j$−1. In particular, the syndrome calculator 31 may comprise an elementary check node processor 501-1 configured to determine an intermediary message and the associated intermediary binary vector with each component of the intermediary message by processing two input messages $U_1$ and $U_2$. The remaining elementary check node processors 501-l for l=2, . . . , $d_j$−1 may be each configured to determine an intermediary message and the intermediary binary vector associated with each component of the intermediary message by processing one input message and one intermediary message previously determined by an elementary check node processor 501-a for a=1, . . . , l−2 operating at a previous stage in the serial architecture.

According to some other embodiments, the syndrome calculator 31 may comprise a plurality of elementary check node processors implemented in a parallel architecture (hereinafter referred to as 'tree architecture'). In such embodiments, the syndrome calculator 31 may comprise at least one elementary check node processor 311 configured to determine an intermediary message and the intermediary binary vector associated with each component of the intermediary message by processing two input messages. The remaining elementary check node processors 311 may be configured to determine an intermediary message and the intermediary binary vector associated with each component of the intermediary message either by processing two input messages or by processing two intermediary messages previously determined by two elementary check node processors 311 operating at previous stages of the tree architecture.

Figure 6:
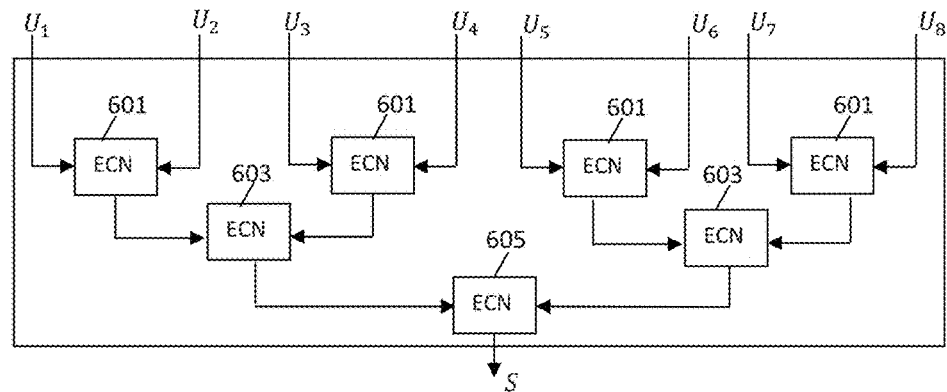
FIG. 6 is a block diagram representing the structure of a syndrome calculator according to an embodiment in which a plurality of elementary check node processors are implemented in a tree architecture.

FIG. 6 shows a structure of a syndrome calculator 31 of degree $d_j$=8 implementing a tree architecture. As shown, the parallel architecture comprises 3 stages (hereinafter referred to as 'layers'). The elementary check node processors 601 comprised at the first layer may be configured each to determine an intermediary message by processing two input messages. The elementary check node processors 603 comprised at the second layer may be each configured to determine an intermediary message by processing two intermediary messages delivered by the elementary check nodes 601 in the first layer of the architecture. The elementary check node processors 605 comprised at the third layer may be each configured to determine an intermediary message by processing two intermediary messages delivered by the elementary check nodes 603 in the second layer of the architecture.

Figures 13, 14:
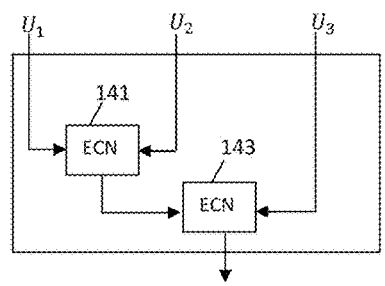
FIG. 13 is a table illustrating the complexity in terms of the number of elementary check node processors, and of the number of inputs/outputs of the elementary check node processors according to some embodiments of the invention.
FIG. 14 is a block diagram representing the structure of a syndrome calculator according to an embodiment in which a plurality of elementary check node processors are implemented in a hybrid architecture.

According to some other embodiments, the syndrome calculator 31 may comprise a plurality of elementary check node processors 311 implemented in a hybrid architecture mixing the serial and the tree architectures as depicted in FIG. 14. In such embodiments, the syndrome calculator 31 may comprise at least one elementary check node processor 141 configured to determine an intermediary message and the intermediary binary vector associated with each component of the intermediary message by processing two input messages and at least one elementary check node processor 143 configured to determine an intermediary message and the intermediary binary vector associated with each component of the intermediary message by processing an input message and the intermediary message generated by the elementary check node processors 141 located at a previous stage of the hybrid architecture.

Regardless of the implementation architecture of the elementary check node processors 311 in the syndrome decoder, the syndrome calculator 31 may be configured to determine each syndrome $S_r=(S_r^{\oplus}, S_r^+, S_r^{DBV})$ in the set $S=\{S_1, S_2, \ldots, S_{NS}\}$ of NS syndromes from the intermediary message delivered by the last elementary check node processor 311 in the architecture obtained from all the input messages.

For example, in embodiments using a serial implementation as illustrated in FIG. 5, the set of syndromes may be determined from the intermediary message delivered by the elementary check node processor 501-$d_j$−1.

In another example using a tree implementation, as illustrated in FIG. 6, the set of syndromes may be determined from the intermediary message delivered by the elementary check node processor 605 located at the last stage of the tree architecture.

Accordingly, a symbol $S_r^\oplus$ comprised in the syndrome $S_r$ for r=1, ..., NS can be expressed as a function of the symbols comprised in the input messages according to:

$$S_r^\oplus = S_r^\oplus(u_1, u_2, \ldots, u_{d_j}) = U_1^\oplus[u_1] \oplus U_2^\oplus[u_2] \oplus \ldots \oplus U_{d_j-1}^\oplus[u_{d_j-1}] \oplus U_{d_j}^\oplus[u_{d_j}] \quad (5)$$

In equation (5), each index $u_i$ for i=1, ..., $d_j$ varies in the set $\{0, 1, \ldots, n_{m,in}-1\}$.

Further, the reliability metric $S_r^+$ associated with the symbol $S_r^\oplus$ can be expressed as a function of the reliability metrics comprised in the different components of the input messages according to:

$$S_r^+ = S_r^+(u_1, u_2, \ldots, u_{d_j}) = U_1^+[u_1] + U_2^+[u_2] + \ldots + U_{d_j-1}^+[u_{d_j-1}] + U_{d_j}^+[u_{d_j}] \quad (6)$$

Moreover, the binary vector $S_r^{DBV}$ comprised in the syndrome $S_r$ may be written as a function of the initial binary values associated with each component of the input message, as determined by the syndrome calculator 31 according to:

$$S_r^{DBV} = S_r^{DVB}(u_1, u_2, \ldots, u_{d_j}) = (U_1^{DBV}[u_1] \| \ldots \| U_{d_j}^{DBV}[u_{d_j}]) \quad (7)$$

According to equation (7), a binary vector $S_r^{DBV}$ comprised in a syndrome $S_r$ comprises $d_j$ bits.

The check node processing unit 215 may further comprise a decorrelation unit 33 configured to determine, in association with each output message $V_i$, a set of candidate components denoted by $V'_i$ from the determined set of NS syndromes S. Each candidate component comprising a symbol and the reliability metric associated with the symbol.

According to some embodiments (illustrated in FIG. 3), the decorrelation unit 33 may comprise $d_j$ elementary decorrelation units 313-i for i=1, ..., $d_j$, each elementary decorrelation unit 313-i being associated with an output message $V_i$ and being configured to determine the set of candidate components $V'_i$ depending on the binary vectors comprised in each syndrome of the set of syndromes S. The binary vectors called Discard Binary Vectors (DBVs) may be accordingly used to indicate for which output edge a syndrome should be discarded and therefore not selected by the decorrelation unit 33. More specifically, an elementary decorrelation unit 313-i may be configured to determine a set of candidate components $V'_i$ in association with each output message $V_i$ by selecting, among the determined set of syndromes S, the syndromes comprising binary vectors $S_r^{DBV} = (S_r^{DBV}[1] \| S_r^{DBV}[2], \ldots \| S_r^{DBV}[d_j])$ such that the bit $S_r^{DBV}[i]$ associated with the output message $V_i$ is equal to a given value. A reading of the bit in the binary vector comprised in a syndrome may be used to validate or not validate the selection of the syndrome so as to determine the set of candidate components in association with a given output message. Each elementary decorrelation unit 313-i may be accordingly configured to determine the set of candidate components $V'_i$ from the symbols and their reliability metrics comprised in the selected syndromes, the candidate components corresponding to the components comprised in the validated syndromes.

According to an embodiment, an elementary decorrelation unit 313-i may be configured to determine a set of candidate components $V'_i$ in association with each output message $V_i$ by selecting, among the determined set of syndromes S, the syndromes comprising binary vectors $S_r^{DBV} = (S_r^{DBV}[1] \| S_r^{DBV}[2], \ldots, \| S_r^{DBV}[d_j])$ such that the bit $S_r^{DBV}[i]$ associated with the output message $V_i$ is equal to zero ('0').

According to another embodiment, an elementary decorrelation unit 313-i may be configured to determine a set of candidate components $V'_i$ in association with each output message $V_i$ by selecting, among the determined set of syndromes S, the syndromes comprising binary vectors $S_r^{DBV} = (S_r^{DBV}[1] \| S_r^{DBV}[2], \ldots, \| S_r^{DBV}[d_j])$ such that the bit $S_r^{DBV}[i]$ associated with the output message $V_i$ is equal to one ('1').

According to some embodiments in which a serial architecture of the elementary check node processors 311 is used at the syndrome calculator 31, the decorrelation unit 33 may be simplified and may comprise $d_j$-1 elementary decorrelation units 313-i with i=1, ..., $d_j$-1.

Figure 7:
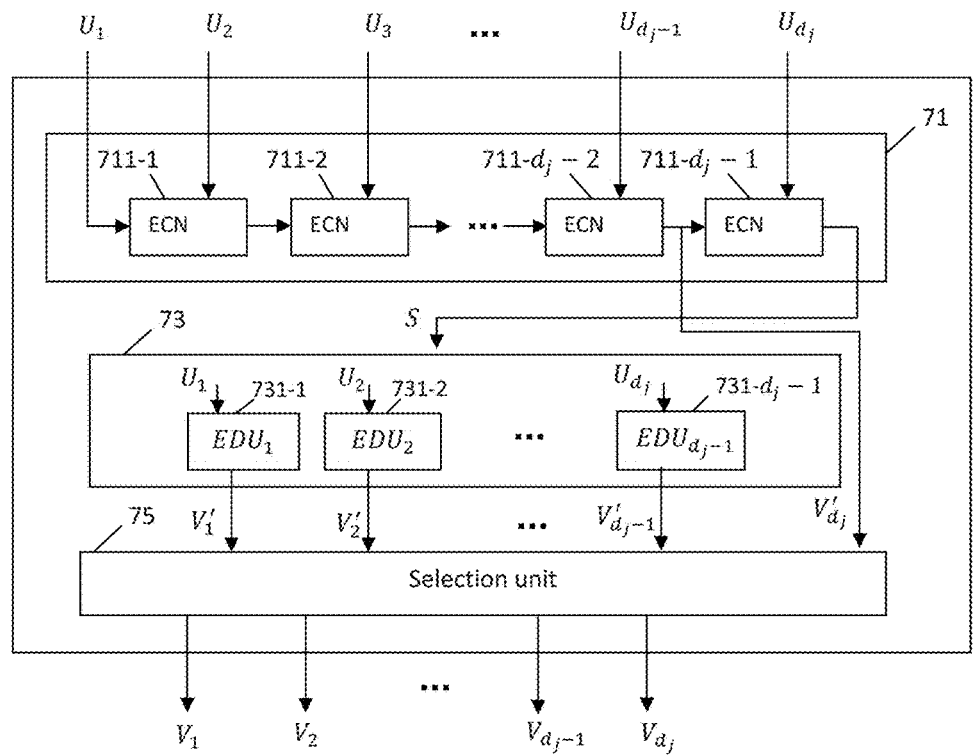
FIG. 7 is a block diagram representing the structure of a check node processing unit according to some embodiments in which a serial implementation of elementary check node processors is used.

FIG. 7 is a block diagram illustrating the structure of a check node processing unit 215 according to some embodiments in which the decorrelation unit 73 comprises $d_j$-1 elementary decorrelation units 713-i with i=1, ..., $d_j$-1, an elementary decorrelation unit 713-i being configured to determine a set of candidate components $V'_i$ in association with the output message $V_i$ for the output messages $V_1, V_2, \ldots, V_{d_j-1}$. In such embodiments, the set of candidate components $V'_{d_j}$ associated with the output message $V_{d_j}$ may be determined from the intermediary message generated by the penultimate elementary check node processor 711-$d_j$-2 in the serial architecture without performing the decorrelation step. This may be done because the intermediary message delivered by the penultimate elementary check node processor 711-$d_j$-2 does not contain the contribution of the input message $U_{d_j}$ previously received from the variable node processing unit 217 to which the output message $V_{d_j}$ will be sent. As a result, in such an embodiment, it is not needed to use a decorrelation step for the determination of the set of candidate components associated with the output message $V_{d_j}$, thereby resulting in a simpler structure of the check node processing unit 215.

The check node processing 215 may further comprise a selection unit 35 configured to determine each output message $V_i$ by selecting components comprising distinct symbols from the set of candidate components $V'_i$ depending on the reliability metrics of the symbols comprised in the set of candidate components $V'_i$. Accordingly, the selection unit 35 may be configured to retain, from the components in the set of candidate components $V'_i$ comprising redundant symbol, the components which comprise the most reliable distinct symbols.

According to some embodiments, the selection unit 35 may e configured to determine each output message $V_i$ by selecting a predefined number $n_{m,out}$ of components from the set of candidate components $V'_i$ associated with the output message $V_i$ depending on the reliability metrics of the symbols comprised in the set of candidate components $V'_i$. Accordingly, the selection unit 35 may be first configured to perform a redundancy elimination in the set of candidate components $V'_i$ for keeping, among the components comprising the same symbol (i.e. among the components comprising redundant symbols), the one which comprises the most reliable symbol. In a second step, the selection unit 35 may be configured to select a predefined number $n_{m,out}$ of components from the processed candidate components, depending on the reliability metrics of the symbols comprised in the processed candidate components, such that the $n_{m,out}$ components comprising the most reliable distinct symbols are selected.

According to some embodiments, the selection units 35 implemented in the various check node processing units 215 may be configured to select a same predefined number $n_{m,out}$ of components to determine the output messages.

According to other embodiments, the selection units 35 implemented in the various check node processing units 215 may be configured to select a different predefined number $n_{m,out}$ of components to determine the output messages. In such embodiments, the variables node processing units 217 recipients of these output messages may be configured to perform a truncation operation to retain a same number of components in each received message.

In some embodiments, the predefined number of components $n_{m,out}$ may depend on the number of components $n_{m,in}$ comprised in the input messages.

The predefined number of components $n_{m,out}$ may further depend on the Field over which the code is constructed and/or on the order of the decoding iteration of the iterative decoding process and/or on the signal-to-noise ratio and/or on the computational and storage capabilities of the check node processing units 215.

In some other embodiments, the number of components $n_{m,out}$ may depend on a combination of the factors previously cited.

For example, for Galois Fields over GF(64), the number of components $n_{m,out}$ may be related to the number of components comprised in input messages according to $n_{m,out}=3n_{m,in}$. For Galois Fields over GF(1024), the number of components $n_{m,out}$ may be related to the number of components comprised in input messages according to $n_{m,out}=15n_{m,in}$.

Figure 8:
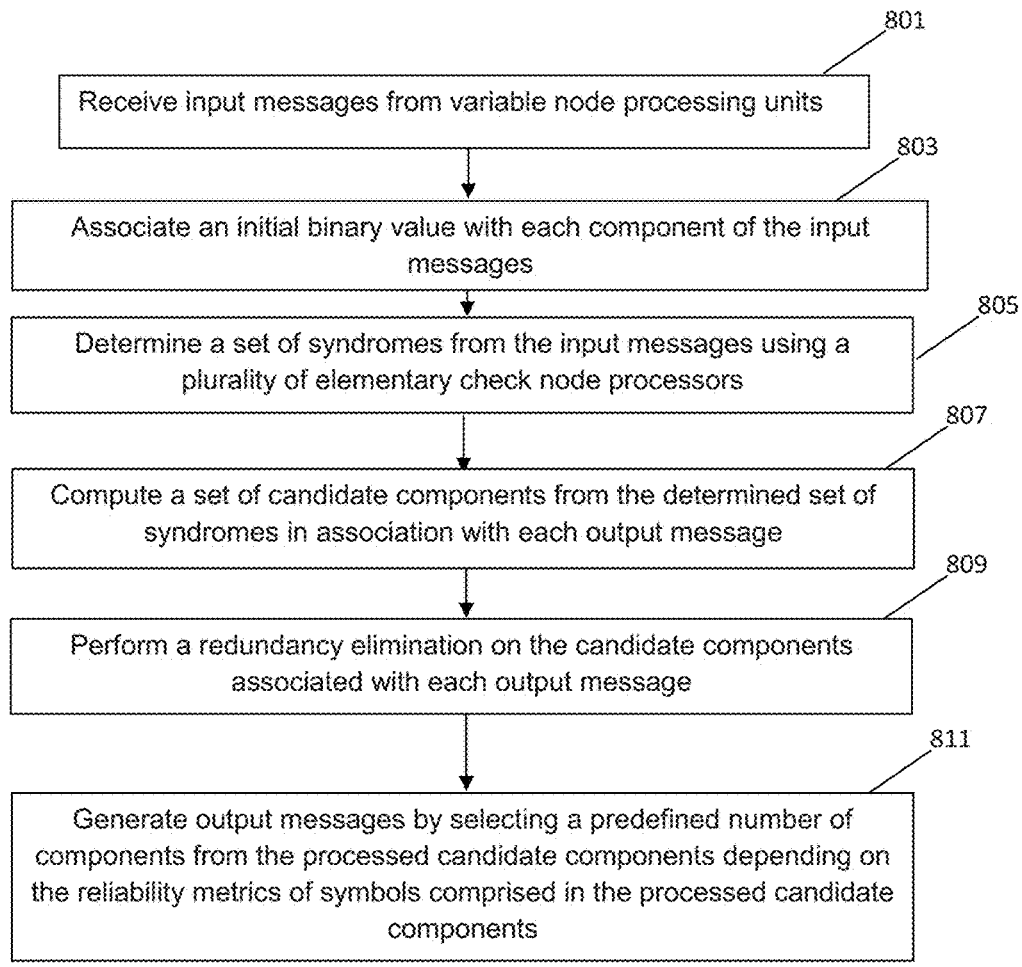
FIG. 8 is a flowchart depicting a method of determining output messages at a check node processing unit based on syndrome decoding using a plurality of elementary check node processors, according to some embodiments.

FIG. 8 is a flowchart depicting a method of determining output messages at a check node processing unit implemented in the EMS algorithm for decoding non-binary LDPC codes, according to some embodiments in which syndrome decoding using a plurality of elementary check node processors is performed at the check node processing units.

The following description of some embodiments will be made with reference to soft-output decoding and reliability metrics represented in the logarithm domain by log-likelihood ratio (LLR) values, for illustration purpose only. However, the skilled person will readily understand that other types of decoding and reliability metrics may be used to measure the reliability of symbols.

The method of the computation of output messages at a check node processing unit is a part of the messages exchange performed during the iterative decoding process of the EMS algorithm. The decoding process may be performed to determine an estimate ĉ of an original codeword c from a received noisy sequence represented by a vector y by applying the Belief Propagation decoding rule. The codeword c may have been encoded at the transmitter using a non-binary LDPC code designated by $\mathcal{C}$ (n, k) constructed over the Galois Field GF(q) with q>2.

The following description of some embodiments will be made mainly with a focus on the steps performed at a check node processing unit for the sake of clarity. A check node processing unit of degree $d_j$ configured to receive $d_j$ sorted and truncated input messages $U_1, U_2, \ldots, U_{d_j}$ and to generate $d_j$ output messages $V_1, V_2, \ldots, V_{d_j}$ will be considered in the following.

Step 801 may be performed to receive the input messages from the connected variable nodes in the corresponding Tanner graph. Accordingly, $d_j$ input messages $U_1, U_2, \ldots, U_{d_j}$ may be received. Input messages may be sorted and truncated previously by the variable node processing units or the check node processing units. Accordingly, each input message may comprise $n_{m,in} \ll q$ components sorted in a given order of the reliability metrics comprised in each component.

In particular embodiments in which the LLR is the metric measuring the reliability of a symbol, the most reliable symbols are those which have the smallest LLR values. Accordingly, each input message $U_i$ may be written in a vector notation according to $U_i=(U_i[0], U_i[1], \ldots, U_i[n_{m,in}-1])$ such that each component $U_i[j]=(U_i^{\oplus}[j], U_i^+[j])$ for $j=0, \ldots, n_{m,in}-1$ comprises a symbol denoted by $U_i^{\oplus}[j]$ and the LLR metric denoted by $U_i^+[j]$ associated with the symbol and such that the component carrying the most reliable symbol corresponds to the component $U_i[0]$, for $i=1, \ldots, d_j$ with $U_i^+[u] \leq U_i^+[v]$ for each $0 \leq u < v \leq n_{m,in}-1$.

Step 803 may be performed to associate an initial binary value with each component $U_i[j]$ for $j=0, \ldots, n_{m,in}-1$ comprised in the input messages $U_i$ for $i=1, \ldots, d_j$.

According to some embodiments, the initial value associated with the components $U_i[j]$ may depend on the reliability metrics $U_i^+[j]$. In particular, an initial binary value equal to a predefined first value may be associated with the component comprising the most reliable symbol and an initial binary value equal to a predefined second value may be associated with the remaining components.

According to some embodiments, the predefined first value may be equal to zero ('0') and the predefined second value may be equal to one ('1'). Accordingly, the initial binary value denoted by $U_i^{DBV}[j]$ associated with a component $U_i[j]$ may be determined according to equation (1), i.e. the initial binary value $U_i^{DBV}[j]$ associated with a component $U_i[j]$ comprised in an input message $U_i$ may take the bit '0' if the symbol comprised in said component is the most reliable symbol.

According to other embodiments, the predefined first value may be equal to one ('1') and the predefined second value may be equal to zero ('0'). Accordingly, the initial binary value associated with a component comprised in an input message may be equal to the bit '1' if the symbol comprised in this component is the most reliable symbol, that is $$U_i^{DBV}[j] = \begin{cases} 0 & \text{if } j \neq 0 \\ 1 & \text{if } j = 0 \end{cases}.$$

Step 805 may be performed to determine a set of syndromes denoted by $S=\{S_1, S_2, \ldots, S_{NS}\}$ comprising NS syndromes from the input messages using a plurality of elementary check node processors 311. A syndrome $S_r=(S_r^{\oplus}, S_r^+, S_r^{DBV})$ for $r=1, \ldots, NS$ may comprise a symbol denoted by $S_r^{\oplus}$, the LLR metric associated with the symbol and denoted by $S_r^+$, and a binary vector denoted by $S_r^{DBV}$.

According to some embodiments, the number NS of syndromes in the set of syndromes S may be greater than or equal to the number of components in each input message. For example, the number of syndromes may be given by $NS=3n_{m,out}=9n_{m,min}$ over GF(64).

According to some embodiments, the set of syndromes S may be determined from intermediary results determined from all the input messages.

An intermediary message denoted by $U'_t$ may comprise a number $n_t$ of sorted components and an intermediary binary vector associated with each component, the components comprised in a given intermediary message being sorted into a given order of the reliability metrics of the symbols comprised therein. An intermediary message may be determined by processing a first message and a second message derived from the input messages, the number of input messages being advantageously at least equal to three.

Further, each component comprised in the first message and the second message may be associated with a binary vector derived from the initial binary values in association with the components of the input messages.

Accordingly, a symbol comprised in a component of an intermediary message may be determined by applying an addition operation over the Galois Field to the symbol comprised in a component of the processed first message and the symbol comprised in a component of the processed second message.

Moreover, the LLR metric associated with a symbol comprised in an intermediary message may be determined by applying an addition operation over a given algebraic structure to the LLR metric associated with a component of the first message and the LLR metric associated with a component of the second message.

According to some embodiments, the algebraic structure may be chosen in a group consisting of the field $\mathbb{R}$ of real numbers, the field $\mathbb{Z}$ of integer numbers, and the field $\mathbb{N}$ of natural numbers. For example, in embodiments involving hardware quantized implementations or software implementations, the addition operation may be performed over the field of integer numbers $\mathbb{Z}$ or the field of natural numbers $\mathbb{N}$.

Further, the intermediary binary vector associated with a component of an intermediary message may be determined by applying a vector concatenation of the binary vector associated with a component of the first message and the binary vector associated with a component of the second message.

For an intermediary message determined by processing two input messages denoted respectively by $U_l$ and $U_p$ for $l$ and $p \neq l$ varying in the set of indices from 1 to $d_j$, an intermediary message denoted by $U'_t$ may be determined from the components of the input messages. The intermediary binary vector associated with each component of the intermediary message may be determined from the initial binary values associated with each component of the input messages. Accordingly, an intermediary message $U'_t$ may comprise $n_t$ components $U'_t[j]$ for $j=0, \ldots n_t-1$ and an intermediary binary vector $U'_t{}^{DBV}[j]$ associated with each component $U'_t[j]$. A component $U'_t[j]=(U'_t{}^{\oplus}[j], U'_t{}^+[j])$ for $j=0, \ldots n_t-1$ may comprise a symbol $U'_t{}^{\oplus}[j]$ and the LLR metric $U'_t{}^+[j]$ associated with the symbol. The components of the intermediary message $U'_t$ may be sorted into a given order depending on the reliability metrics of the symbols comprised therein such that $U'_t{}^+[j+1] \geq U'_t{}^+[j]$ for all $j=0, \ldots, n_t-2$.

According to some embodiments, an intermediary message may be determined by processing a number $n_l \leq n_{m,in}$ of components from the first message and/or a number $n_p \leq n_{m,in}$ of components from the second message.

According to some embodiments, an intermediary message may be determined through three steps.

At a first step, a set of auxiliary output components may be determined from the components of the first message $U_l$ and the components of the second message $U_p$. An auxiliary output component is referred to as a "Bubble". A Bubble denoted by $B_t[u][v]$ refers to the Bubble obtained from the component $U_l[u]$ comprised in the first message $U_l$ and the component $U_p[v]$ comprised in the second message $U_p$. The index u varies in $0,1, \ldots, n_{l}-1$ and the index v varies in $0,1, \ldots, n_p-1$. A Bubble may comprise a couple of data comprising a symbol denoted by $B_t{}^{\oplus}[u][v]$ and its LLR metric, denoted by $B_t{}^+[u][v]$. It may also comprise a binary vector denoted by $B_t{}^{DBV}[u][v]$ associated with this couple. The total number of output Bubbles is accordingly given by $n_l \times n_p$.

According to some embodiments, the symbol $B_t{}^{\oplus}[u][v]$ comprised in an auxiliary output component $B_t[u][v]$ for $u=0,1, \ldots, n_l-1$ and $v=0,1, \ldots, n_p-1$ may be determined according to the addition over the Galois Field as previously expressed in equation (2).

According to some embodiments, the LLR metric $B_t{}^+[u][v]$ comprised in an auxiliary output component $B_t[u][v]$ for $u=0,1, \ldots, n_l-1$ and $v=0,1, \ldots, n_p-1$ may be determined according to the addition over the Real Field as previously expressed in equation (3).

According to some particular embodiments, for example in quantized hardware implementations and software implementations, the LLR metric $B_t{}^+[u][v]$ comprised in an auxiliary output component $B_t[u][v]$ for $u=0,1, \ldots, n_l-1$ and $v=0,1, \ldots, n_p-1$ may be determined according to the addition over the integer field $\mathbb{Z}$ or the field of natural numbers $\mathbb{N}$, enabling a complexity reduction.

According to some embodiments, the binary vector $B_t{}^{DBV}[u][v]$ associated with an auxiliary output component $B_t[u][v]$ for $u=0,1, \ldots, n_l-1$ and $v=0,1, \ldots, n_p-1$ may be determined according to the vector concatenation operation as previously expressed in equation (4).

After the computation of the $n_l \times n_p$ auxiliary output components, a sorting step may be performed to order these components in an increasing order of the LLR metrics comprised in each component.

At a last step, a truncation operation may be performed to select, among the $n_l \times n_p$ sorted auxiliary output components, $n_t$ components, which provides the intermediary message $U'_t$ and the binary vector associated with each component of the $n_t$ sorted components comprised in this intermediary message.

According to some embodiments, the number $n_t$ of the components comprised in an intermediary message may be lower than $n_l \times n_p$.

The set of syndromes may be determined from the intermediary message computed using all the input messages.

In embodiments using a serial architecture, the set of syndromes may be determined from the intermediary message delivered by the last elementary check node processor in the serial architecture.

In embodiments using a parallel architecture, the set of syndromes may be determined from the intermediary message delivered by the elementary check node processor located at the last stage of the tree architecture.

Independently of the type of the implementation architecture of the various elementary check node processors 311, the set of syndromes $S_r = (S_r{}^{\oplus}, S_r{}^+{}^S{}_r{}^{DBV})$ for $r=1, \ldots, NS$ may be expressed as a function of the input messages.

Accordingly, the symbol $S_r{}^{\oplus}$ comprised in the syndrome $S_r$ for $r=1, \ldots, NS$ can be expressed as the summation over the Galois field of the symbols $U_i{}^{\oplus}[u_i]$ comprised in the input messages $U_i$ for $i=1, \ldots, d_j$ and $u_i \in [0, n_{m,in}-1]$ according to equation (5).

Further, the LLR metric $S_r{}^+$ comprised in the syndrome $S_r$ for $r=1, \ldots, NS$ can be expressed as the summation over the real field of the LLR metrics $U_i{}^+[u_i]$ comprised in the input messages $U_i$ for $i=1, \ldots, d_j$ and $u_i \in [0, n_{m,in}-1]$ according to equation (6).

Further, the binary vector $S_r{}^{DBV}$ comprised in the syndrome $S_r$ for $r=1, \ldots, NS$ can be expressed as the vector concatenation of the initial binary values $U_i{}^{DBV}[u_i]$ associated with the input messages $U_i$ for $i=1, \ldots, d_j$ and $u_i \in [0,$ $n_{m,in}-1$] according to equation (7). Accordingly, the binary vector $S_r^{DBV}$ comprised in a syndrome $S_r$ comprises $d_j$ bits, each binary value $S_r^{DBV}[i]$ for $i=1, \ldots, d_j$ being associated with an output message $V_i$.

Step 807 may be performed to determine a set of candidate components denoted by $V'_i$, in association with each output message $V_i$, from the determined set of syndromes. Step 807 may comprise applying a decorrelation operation that depends on the binary vector $S_r^{DBV}$ comprised in each syndrome $S_r$. The binary vectors may accordingly indicate for which output message a syndrome should be discarded or selected in order to determine the set of candidate components. As a binary vector $S_r^{DBV}$ comprises $d_j$ bits, each bit $S_r^{DBV}[i]$ for $i=1, \ldots, d_j$ being associated with an output message $V_i$, the value of the bit $S_r^{DBV}[i]$ may be used to validate or not the selection of the syndrome $S_r$ in order to determine the set of candidate components $V'_i$.

More specifically, according to a first embodiment in which the initial binary value associated with the most reliable symbol is equal to '0' (as in equation (1)), if the bit $S_r^{DBV}[i]$ is equal to zero ('0'), then the syndrome $S_r$ is a valid syndrome. The couple of data comprising the symbol $S_r^\oplus$ and its LLR metric $S_r^+$ of the valid syndrome $S_r$ maybe then selected to form a candidate component among the candidate components.

According to another embodiment in which the initial binary value associated with the most reliable symbol is equal to '1', if the bit $S_r^{DBV}[i]$ is equal to one ('1'), then the syndrome $S_r$ is a valid syndrome. The couple of the symbol $S_r^\oplus$ and its LLR metric $S_r^+$ of the valid syndrome $S_r$ maybe then selected to form a candidate component among the set of candidate components.

According to some embodiments, the decorrelation operation may be performed to determine a set of candidate components $V'_i$ in association with each output message using $d_j$ elementary decorrelation operations, each elementary decorrelation operation being performed to determine a set of candidate components in association with a given output message.

According to some other embodiments typically using a serial architecture, the decorrelation operation may be performed using only $d_j-1$ elementary decorrelation operations. The set of candidate components associated with the last elementary check node processor in the serial architecture may be determined from the intermediary message delivered by the penultimate elementary check node processor.

At step 809, a redundancy elimination operation may be performed on the determined set of candidate components associated with each output message for retaining, from the components comprising the same symbol, the component comprising the most reliable symbol corresponding to the smallest LLR metric. In other words, the components that give rise to a same symbol value are processed such that the component comprising the redundant symbol associated with the smallest LLR metric is kept.

Step 811 may be performed to generate the output messages $V_i$ for $i=1, \ldots, d_j$ from the processed sets of candidate components. An output message $V_i$ may be determined by selecting a predefined number $n_{m,out}$ of the most reliable components from the processed set of candidate components, i.e. by selecting the $n_{m,out}$ components comprising the symbols associated with the smallest LLR metrics.

Figure 9:
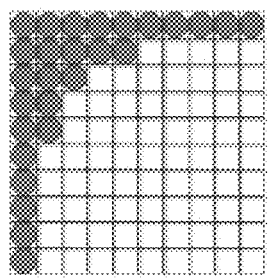
FIG. 9 is a diagram illustrating a matrix representation of the components of two input messages processed by an elementary check node processor according to some embodiments.

FIG. 9 illustrates a two-dimensional matrix representation of two input messages comprising each $n_{m,in}=10$ components processed by an elementary check node processor 311 according to some embodiments of the invention. This representation corresponds to the processing of a first message comprising $n_f=n_{m,in}=10$ components and a second message comprising $n_p=n_{m,in}=10$ components. The vertical axis refers to the processed components of the first message. The horizontal axis refers to the processed components of the second message. The possible combinations of each component from the first message with each component from the second message are represented by grey circles and are referred to as 'Bubbles'. They correspond to the auxiliary output components, i.e. to the possible values of the components of the intermediary message determined from the first and second messages. The number of Bubbles expresses the computational complexity involved at an elementary check node processor for determining an output message. FIG. 9 corresponds to an elementary check node processor represented by the tuple ($n_f=n_{m,in}=10$, $n_p=n_{m,in}=10$, $n_t=10$) where the last element in the tuple corresponds to the number of components of the delivered intermediary message. This configuration of the elementary check node processor is similar to the configurations used by the S-Bubble and the L-Bubble algorithms. In the configurations used by the S-Bubble and the L-Bubble algorithms, the input components of the processed first and second messages as well as the components of the output components comprised in the determined intermediary message take values in the set $\{0, \ldots, n_{m,in}-1\}$.

Figure 10:
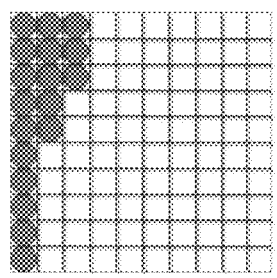
FIG. 10 is a diagram illustrating a matrix representation of the components of two input messages processed by an elementary check node processor, according to an embodiment.

FIG. 10 illustrates exemplary Bubbles obtained according to some embodiments of the invention in which an elementary check node processor is used to process a number $n_p$ of components of a second message such that $n_p$ is lower than $n_{m,in}$. The elementary check node processor is accordingly represented by the tuple ($n_f=10$, $n_p=3$, $n_t=10$). The selected set of candidate among the 18 Bubbles is in this case given by $n_t=10$.

Figure 11:
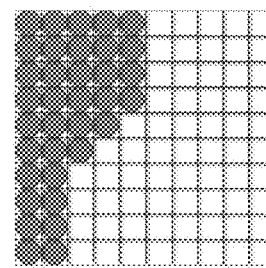
FIG. 11 is a diagram illustrating a matrix representation of the number of components of two input messages processed by an elementary check node processor, according to another embodiment.

FIG. 11 illustrates exemplary Bubbles obtained according to some embodiments of the invention in which an elementary check node processor is configured to process a number $n_p$ of components of a second message such that $n_p$ is lower than $n_{m,in}$. The elementary check node processor is accordingly represented by the tuple ($n_f=10$, $n_p=5$, $n_t=20$). It should be noted that the number of Bubbles compared to the results of FIG. 10 is higher (35 versus 18).

Figure 12:
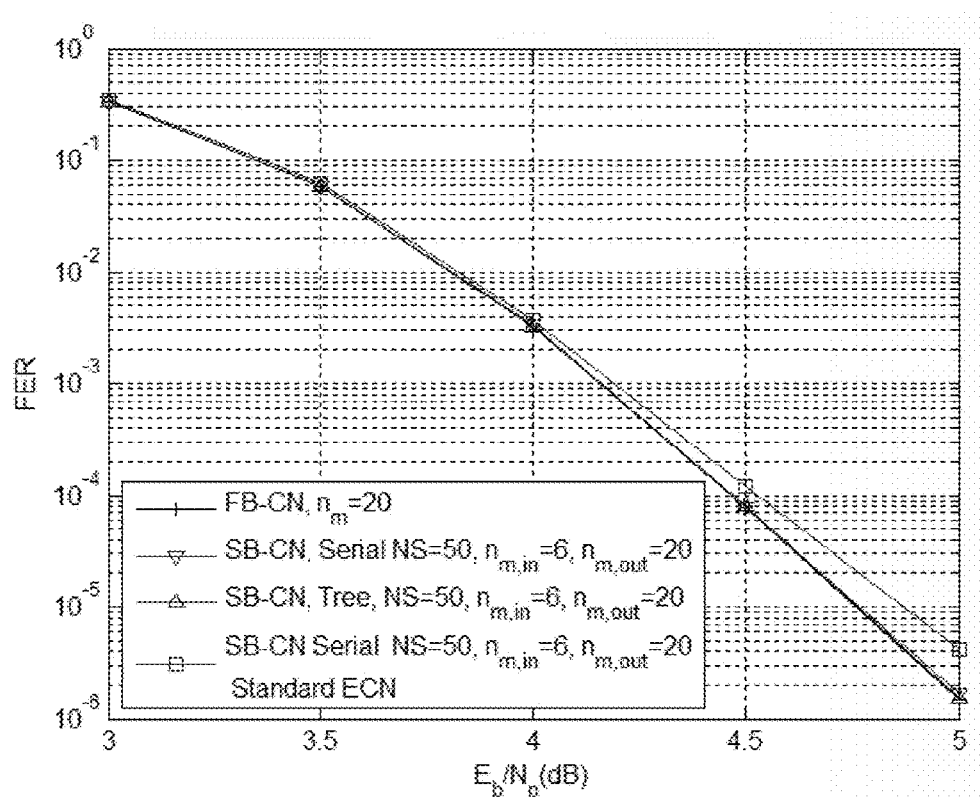
FIG. 12 is a diagram illustrating the Frame Error Rate obtained using the syndrome decoding involving a number of elementary check node processors, according to some embodiments of the invention.

FIG. 12 illustrates the error probability performance evaluated in terms of Frame Error Rate (FER) of decoding a (576,480) non-binary LDPC code constructed over GF(64) under the AWGN channel using the EMS algorithm according to some embodiments using 10 iterations of the messages exchange process between the variable and check nodes. The FER is evaluated for four implementations of the EMS algorithm:

1. 'FB $n_m=20$' (in FIG. 12 $n_m$ designates $n_{m,in}$) refers to embodiments using the prior-art forward backward architecture based on the S-Bubble algorithm where elementary check node processors represented by ($n_f=20$, $n_p=20$, $n_t=20$) are used.
2. 'SB-CN, Serial NS=50, $n_{m,in}=6$, $n_{m,out}=20$' refers to some embodiments of the invention in which a serial implementation of 11 elementary check node processors 311 in the syndrome calculator 31 is used. The corresponding serial implementation comprises an elementary check node processor 311 represented by the tuple ($n_f=6$, $n_p=6$, $n_t=25$) and an elementary check node processor 311 represented by the tuple ($n_f=6$, $n_p=25$, $n_t=50$). The remaining 9 elementary check node processors 311 are represented by the tuple ($n_f=6$, $n_p=50$, $n_t=50$).
3. 'SB-CN, Tree NS=50, $n_{m,in}=6$, $n_{m,out}=20$' refers to some embodiments of the invention in which a tree implementation of 11 elementary check node processors 311 in the syndrome calculator 31 is used. The corresponding tree implementation comprises 6 elementary check node processors 311 represented by the tuple ($n_t$=6, $n_p$=6, $n_t$=25) at a first stage (i.e. level in the tree representing the parallel implementation), two elementary check node processors 311 represented by the tuple ($n_t$=25, $n_p$=25, $n_t$=50) at a second stage, three elementary check node processors 311 represented by the tuple ($n_t$=50, $n_p$=50, $n_t$=50) at a third stage, and an elementary check node processor 311 represented by the tuple ($n_t$=50, $n_p$=50, $n_t$=50) at the last stage.

4. 'SB-CN, Serial NS=50, $n_{m,in}$6, $n_{m,out}$=20 Standard ECN' refers to a serial implementation of the elementary check node processors 311 at the syndrome calculator 31 where the elementary check node processors 311 perform the traditional operations used in the existing forward backward architecture.

It should be noted that the conventional operations performed by an elementary check node processor, in contrast to the operations performed by an elementary check node processor according to the embodiments of the present invention, involve a redundancy elimination operation that removes redundant components from auxiliary output components or Bubbles.

Depicted error performance results show that the proposed serial and parallel implementations of syndrome decoding using elementary check node processors provide a same performance as the forward-backward architecture, which shows the optimality of the methods according to the embodiments of the invention. In addition, numerical results show the efficiency of the elementary check node processors according to the various embodiments against the operations used in the conventional elementary check node processors. Indeed, when applied to syndrome computation, the processing performed by conventional elementary check node processors fails to achieve optimal error performance and presents a significant loss especially at high signal-to-noise ratio values. This performance loss is due to the redundancy elimination operation performed at the level of the elementary check node processors.

In addition to the error probability performance, the complexity of the following implementations was evaluated in terms of the number of elementary check node processors (ECNs), the number of sorted input couples, and the total number of the auxiliary outputs of the elementary check node processors: 'FB $n_m$=20', 'SB-CN, Serial NS=50, $n_{m,in}$=6, $n_{m,out}$=20', and 'SB-CN, Tree NS=50, $n_{m,in}$=6, $n_{m,out}$=20'. The results are shown in FIG. 13. Numerical results show the reduced complexity of these implementations of the syndrome-based decoder according to some embodiments, in which syndromes are computed using elementary check node processors, compared to the existing forward backward architectures. The architecture according to the embodiments of the invention uses a lower number of elementary check node processors. Compared to the existing forward backward architecture, the number of ECNs is reduced from $3(d_j-2)$ to $(d_j-1)$ with architecture according to some embodiments of the invention. Compared to a conventional syndrome based decoder, the number of computed syndromes is reduced to $3n_{m,out}$ with the architecture according to some embodiments of the invention, and the syndromes are sorted without requiring additional sorting of the outputs.

The architecture according to the embodiments of the invention accordingly provides optimal decoding performance with a significant reduction of the decoding computational complexity and implementation hardware cost.

The methods and devices described herein may be implemented by various means. For example, these techniques may be implemented in hardware, software, or a combination thereof. For a hardware implementation, the processing elements of an iterative decoder 123 can be implemented for instance according to a hardware-only configuration (as an example, in one or more FPGA, ASIC or VLSI integrated circuits with the corresponding memory) or according to a configuration using both VLSI and DSP.

While embodiments of the invention have been illustrated by a description of various examples, and while these embodiments have been described in considerable detail, it is not the intent of the applicant to restrict or in any way limit the scope of the appended claims to such details. Additional advantages and modifications will readily appear to those skilled in the art. The invention in its broader aspects is therefore not limited to the specific details, representative methods, and illustrative examples shown and described.

In particular, while the description of some embodiments of the invention has been performed with reference to a particular implementation to the EMS algorithm, it should be noted that the invention may be also applied to other iterative decoding algorithms such as the min-max algorithm.

Furthermore, while some embodiments of the invention have been described with reference to error correcting codes constructed over Galois Fields, the skilled person will readily understand that the proposed embodiments based on elementary check node processing for syndrome computation may be also applied to any LDPC codes and any graph error correcting code constructed over non-commutative groups such as polynomial codes (e.g. cyclic codes).

Further, even if the invention has some advantages in an application to communication systems, it should be noted that the invention is not limited to such communication devices and may be integrated in numerous devices such as data storage devices.

The methods described herein can be implemented by computer program instructions supplied to the processor of any type of computer to produce a machine with a processor that executes the instructions to implement the functions/acts specified herein. These computer program instructions may also be stored in a computer-readable medium that can direct a computer to function in a particular manner. To that end, the computer program instructions may be loaded onto a computer to cause the performance of a series of operational steps and thereby produce a computer implemented process such that the executed instructions provide processes for implementing the functions specified herein.

The invention claimed is:

1. A decoder for decoding a signal encoded using an error correcting code, comprising:
   an input for receiving the encoded signal comprising at least three input message:
   a check node processing unit being configured to process the at least three input messages delivered by at least one variable node processing unit, and to generate at least one output message, wherein the check node processing unit comprises:
      a syndrome calculator configured to determine a set of syndromes from said at least three input messages using at least two elementary check node processors, each syndrome comprising a symbol, a reliability metric associated with said symbol, and a binary vector comprising at least one binary value;
      a decorrelation unit configured to determine, in association with at least an output message, a set of candidate components from said set of syndromes, each candidate component comprising a symbol and a reliability metric associated with said symbol, said set of candidate components comprising one or more pairs of components comprising a similar symbol; and a selection unit configured to determine at least an output message by selecting components comprising distinct symbols from the set of candidate components associated with said at least an output message;

an output for outputting the decoded signal comprising said at least an output message.

2. The decoder of claim 1, wherein at least one elementary check node processor is configured to determine an intermediary message from a first message and a second message, said first message and second message being derived from said at least three input messages, said intermediary message comprising one or more components and an intermediary binary vector associated with each component, an intermediary binary vector comprising at least one binary value, each component comprising a symbol and a reliability metric associated with said symbol, said one or more components being sorted into a given order of the reliability metrics of symbols, the syndrome calculator being configured to determine said set of syndromes from the intermediary message determined from all input messages.

3. The decoder of claim 1, wherein each message from said at least three input messages comprises one or more components, each component comprising a symbol and a reliability metric associated with said symbol, at least one elementary check node processor being configured to determine the symbol comprised in a component of said intermediary message by applying an addition operation over a field of construction of said at least one error correcting code, said addition operation being applied to the symbol comprised in a component of said first message and to the symbol comprised in a component of said second message.

4. The decoder of claim 1, wherein at least one elementary check node processor is configured to determine the reliability metric comprised in a component of said intermediary message by applying an addition operation over a given algebraic structure, said addition operation being applied to the reliability metric comprised in a component of said first message and to the reliability metric comprised in a component of said second message, said algebraic structure being chosen in a group consisting of the field of real numbers, the field of integer numbers, and the field of natural numbers.

5. The decoder of claim 4, wherein the syndrome calculator is further configured to associate each component comprised in said at least three input messages with an initial binary value, each component of said first message and said second message being associated with a binary vector comprising at least one binary valve derived from said initial binary values, at least one elementary check node processor being configured to determine the intermediary binary vector associated with a component of said intermediary message by applying a vector concatenation operation, said vector concatenation operation being applied to the binary vector associated with a component of said first message and to the binary vector associated with a component of said second message.

6. The decoder of claim 5, wherein the components comprised in each input message are sorted in a given order of the reliability metrics of the symbols comprised in said components, the syndrome calculator being configured to associate the component comprising the most reliable symbol with an initial binary value equal to a predefined first value and to associate the remaining components with an initial binary value equal to a predefined second value.

7. The decoder of claim 6, wherein said predefined first value is equal to zero and said predefined second value is equal to one.

8. The decoder of claim 7, wherein the binary vector comprised in each syndrome comprises a number of bits, each bit of said number of bits being associated with an output message, the decorrelation unit being configured to determine said set of candidate components associated with a given output message by selecting, among said set of syndromes, the syndromes that comprise binary vectors in which the bit associated with said given output message is equal to said predefined first value.

9. The decoder of claim 1, wherein said elementary check node processors are implemented in a serial architecture.

10. The decoder of claim 1, wherein said elementary check node processors are implemented in a tree architecture.

11. The decoder of claim 1, wherein said elementary check node processors are implemented in a hybrid architecture comprising some elementary check node processors implemented in a serial architecture and some elementary check node processors implemented in a tree architecture.

12. The decoder of claim 1, wherein said selection unit is configured to determine at least an output message by selecting a predefined number of components comprising distinct symbols from the set of candidate components associated with said at least an output message depending on the reliability metrics of the symbols in said set of candidate components.

13. The decoder of claim 1, wherein said at least one error correcting code is a non-binary error correcting code.

14. A method performed by a decoder for decoding a signal encoded using an error correcting code, comprising:
receiving the encoded signal comprising at least three input messages delivered by at least one variable node processing unit;
calculating at least one output message at a check node processing unit implemented in said decoder;
determining a set of syndromes from said at least three input messages, each syndrome comprising a symbol, a reliability metric associated with said symbol, and a binary vector comprising at least one binary value;
determining, in association with at least an output message, a set of candidate components from said set of syndromes, each candidate component comprising a symbol and a reliability metric associated with said symbol, said set of candidate components comprising one or more pairs of components comprising a similar symbol;
determining at least an output message by selecting components comprising distinct symbols from the set of candidate components associated with said at least an output message; and
outputting the decoded signal comprising said at least an output message.

15. A non-computer storage medium comprising computing instruction for calculating at least one output message at a check node processing unit implemented in a decoder, said decoder being configured to decode a signal encoded using an error correcting code, the check node processing unit being configured to receive at least three input messages delivered by at least one variable node processing unit, wherein the computing instructions when executed by a processor, cause the processor to:

determine a set of syndromes from said at least three input messages, each syndrome comprising a symbol, a reliability metric associated with said symbol, and a binary vector comprising at least one binary value;

determine, in association with at least an output message, a set of candidate components from said set of syndromes, each candidate component comprising a symbol and a reliability metric associated with said symbol, said set of candidate components comprising one or more pairs of components comprising a similar symbol;

determine at least an output message by selecting components comprising distinct symbols from the set of candidate components associated with said at least an output message; and output the decoded signal comprising said at least an output message.

* * * * *

UNITED STATES PATENT AND TRADEMARK OFFICE
CERTIFICATE OF CORRECTION

PATENT NO. : 10,560,120 B2
APPLICATION NO. : 15/694062
DATED : February 11, 2020
INVENTOR(S) : Cédric Marchand and Emmanuel Boutillon Page 1 of 1

It is certified that error appears in the above-identified patent and that said Letters Patent is hereby corrected as shown below:

In the Claims

In Claim 15, Column 30, Line 59 delete "A non-computer storage medium comprising computing instruction" and insert --A non-transitory computer storage medium comprising computing instructions--

Signed and Sealed this
Fifth Day of May, 2020

Andrei Iancu
*Director of the United States Patent and Trademark Office*